United States Patent
Veches

(10) Patent No.: US 12,446,174 B2
(45) Date of Patent: Oct. 14, 2025

(54) INTERFACES FOR COUPLING A MEMORY MODULE TO A CIRCUIT BOARD, AND ASSOCIATED DEVICES, MODULES, AND SYSTEMS

(71) Applicant: Micron Technology, Inc., Boise, ID (US)

(72) Inventor: Anthony D. Veches, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/667,116

(22) Filed: May 17, 2024

(65) Prior Publication Data
US 2024/0306331 A1    Sep. 12, 2024

Related U.S. Application Data

(62) Division of application No. 17/804,789, filed on May 31, 2022, now Pat. No. 12,004,314.

(51) Int. Cl.
| | |
|---|---|
| *H05K 5/00* | (2025.01) |
| *H01R 12/70* | (2011.01) |
| *H05K 5/02* | (2006.01) |
| *H05K 7/20* | (2006.01) |
| *H05K 1/14* | (2006.01) |

(52) U.S. Cl.
CPC ......... *H05K 5/026* (2013.01); *H01R 12/7076* (2013.01); *H05K 5/0286* (2013.01); *H05K 7/20763* (2013.01); *H05K 1/14* (2013.01); *H05K 1/142* (2013.01)

(58) Field of Classification Search
CPC .. H05K 5/026; H05K 5/0286; H05K 7/20763; H05K 1/14; H05K 1/142; H01R 12/7076
USPC ........................................................ 361/737
See application file for complete search history.

(56) References Cited

U.S. PATENT DOCUMENTS

| | | | | |
|---|---|---|---|---|
| 6,597,062 | B1 * | 7/2003 | Li ........................... | H05K 1/144 257/777 |
| 9,172,165 | B1 * | 10/2015 | Sass ........................ | G06F 1/185 |
| 2011/0151701 | A1 * | 6/2011 | Ngo ....................... | H01R 12/732 439/327 |
| 2013/0088829 | A1 * | 4/2013 | Co ........................... | G06F 1/185 361/679.31 |
| 2013/0164952 | A1 * | 6/2013 | Wu ......................... | H05K 1/142 439/62 |
| 2020/0196489 | A1 * | 6/2020 | Chang ................. | H05K 7/20236 |

* cited by examiner

*Primary Examiner* — Zhengfu J Feng
(74) *Attorney, Agent, or Firm* — TraskBritt

(57) ABSTRACT

This disclosure relates generally to interfaces between memory modules and circuit boards. More specifically, this disclosure relates to interfaces for coupling a memory module to a circuit board such that the memory module is arranged in a plane that is substantially parallel with a plane of the circuit board. Various embodiments disclosed herein include interfaces, memory modules including interfaces or portions of interfaces, and/or circuit boards including interfaces and/or portions of interfaces. Associated devices and systems are also disclosed.

13 Claims, 25 Drawing Sheets

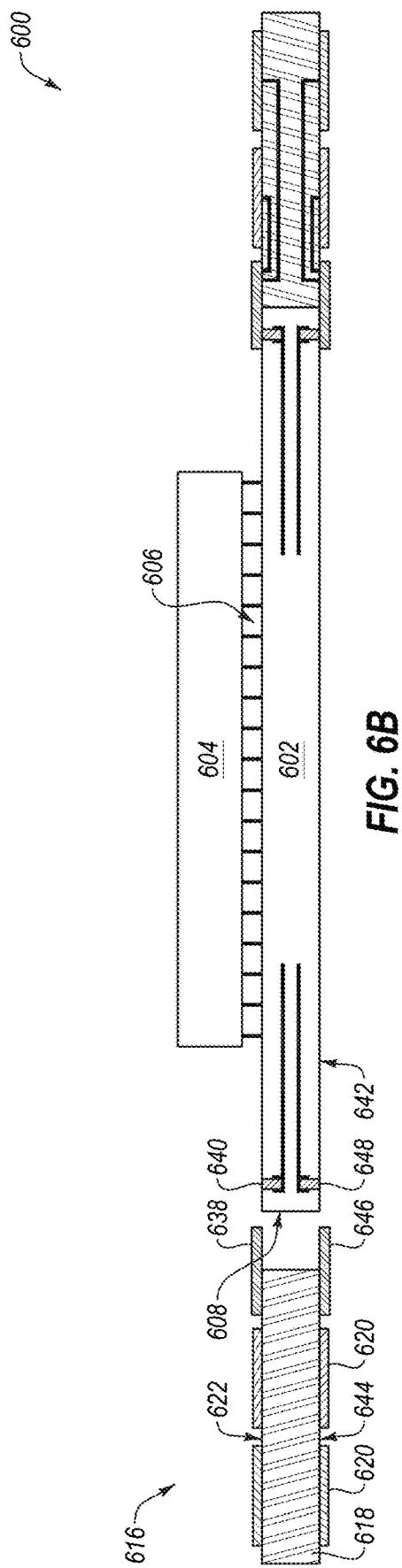

INTERFACES FOR COUPLING A MEMORY MODULE TO A CIRCUIT BOARD, AND ASSOCIATED DEVICES, MODULES, AND SYSTEMS

CROSS-REFERENCE TO RELATED APPLICATION

This application is a divisional of U.S. patent application Ser. No. 17/804,789, filed May 31, 2022, now U.S. Pat. No. 12,004,314, issued Jun. 4, 2024, the disclosure of which is hereby incorporated herein in its entirety by this reference.

TECHNICAL FIELD

Embodiments of the disclosure relate to memory modules, circuit boards, and/or interfaces between memory modules and circuit boards. More specifically, various embodiments relate to interfaces for coupling a memory module to a circuit board such that the memory module is arranged in a plane that is substantially parallel with a plane of the circuit board. Additionally, embodiments include related methods, devices, and systems.

BACKGROUND

Memory devices are typically provided as internal, semiconductor, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data-rate memory (DDR), low-power double-data-rate memory (LPDDR), phase-change memory (PCM), and Flash memory.

A memory module may include multiple memory devices arranged together on a circuit board. A memory module may be coupled to another circuit board (e.g., a motherboard), which may include additional components, such as one or more processors. The coupling between the memory module and the other circuit board may include physical coupling (e.g., retaining the memory module relative to the other circuit board) and electrical coupling (e.g., allowing the additional components of the other circuit board to communicate with the memory devices of the memory module).

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 6B is a side view of a functional block diagram illustrating the device of FIG. 6A in accordance with at least one embodiment of the disclosure.

DETAILED DESCRIPTION

Although various embodiments are described herein with reference to memory devices, the disclosure is not so limited, and the embodiments may be generally applicable to microelectronic systems and/or semiconductor devices that may or may not include memory devices. Embodiments of the disclosure will now be explained with reference to the accompanying drawings.

Figure 1A:
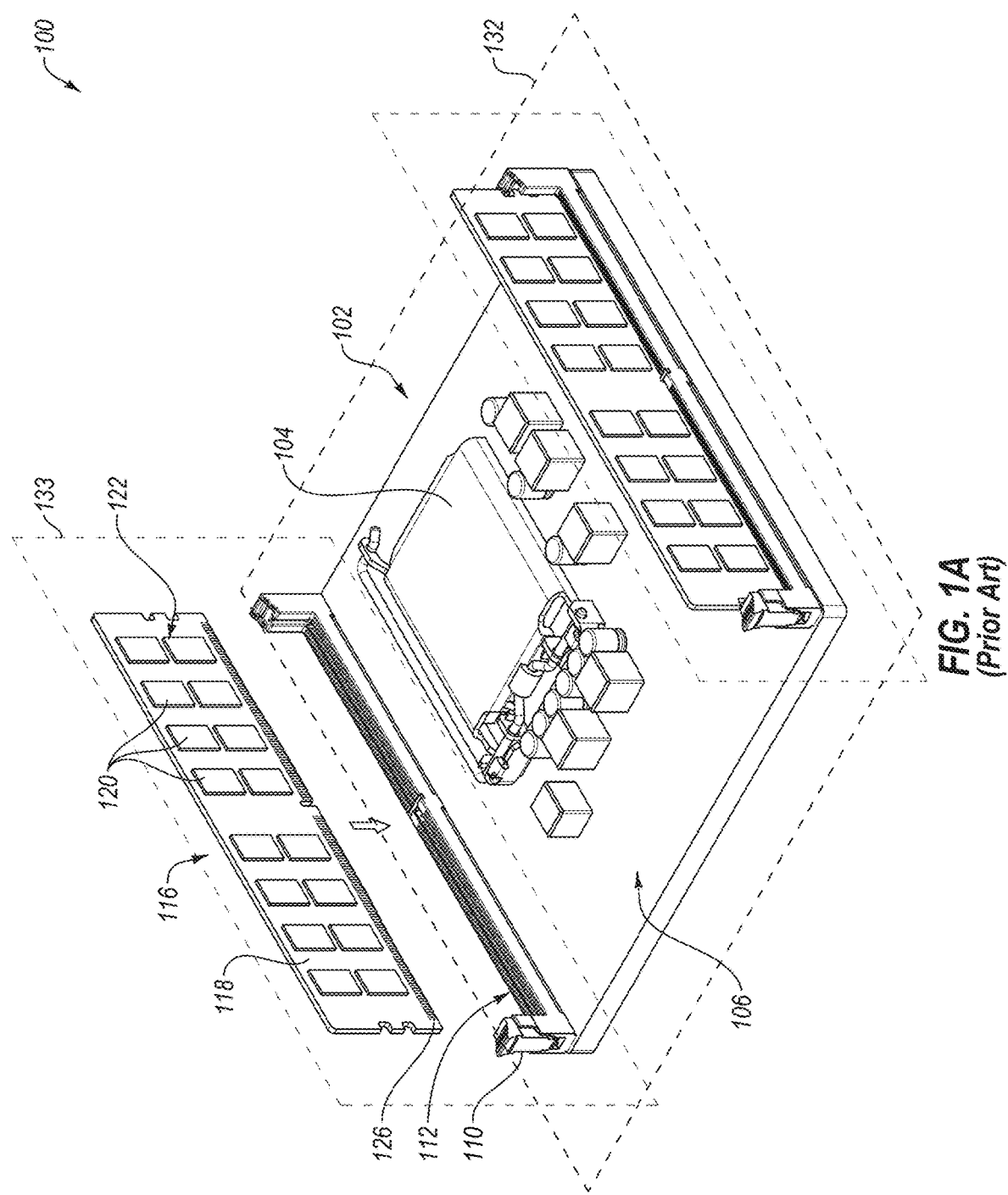
FIG. 1A is a perspective view of a functional block diagram of a device including a circuit board including a socket for retaining a memory module.
Figure 1B:
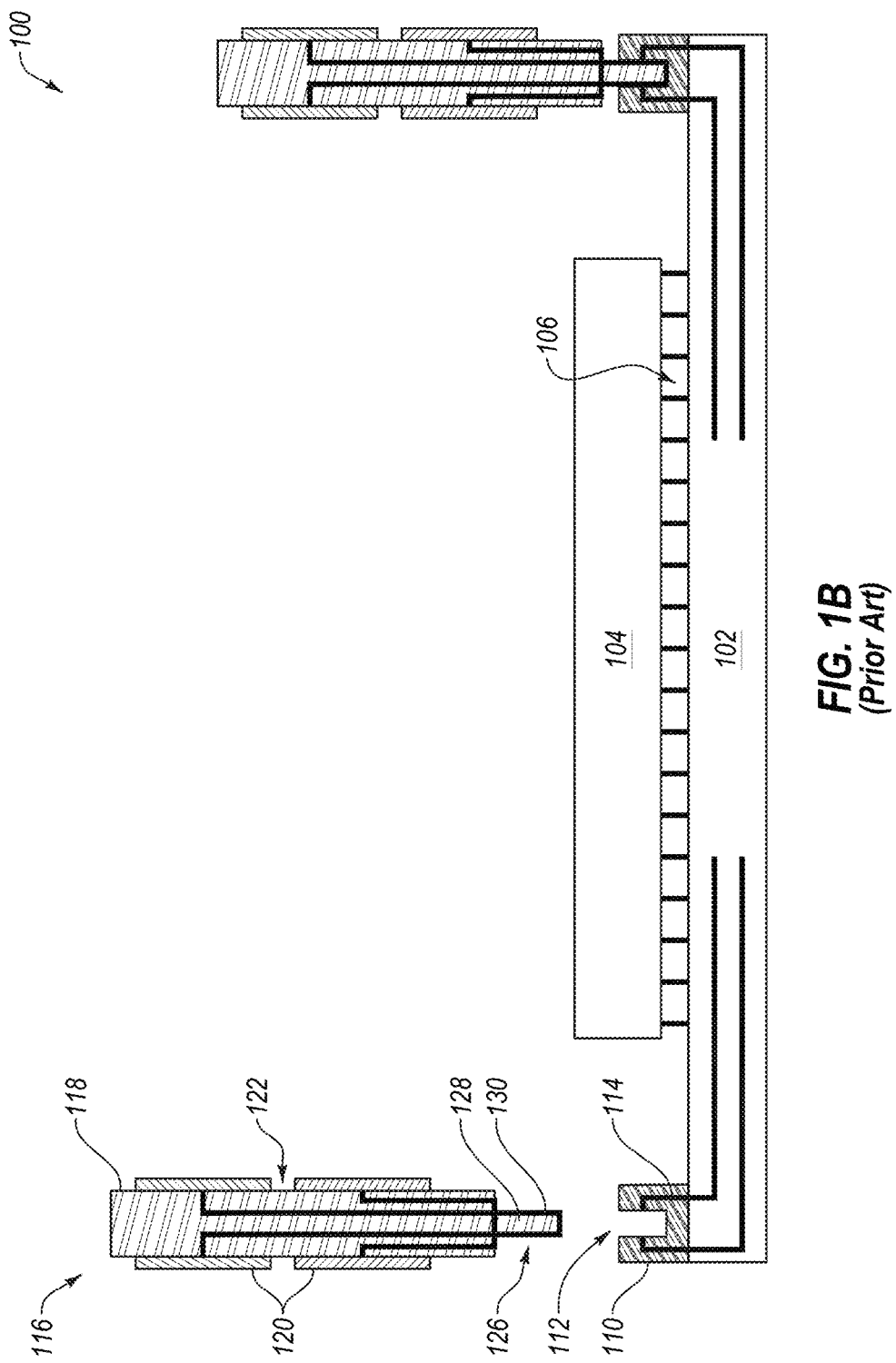
FIG. 1B is a side view of a functional block diagram of the device of FIG. 1A.

FIG. 1A is a perspective view of a functional block diagram of a device 100 including a circuit board 102 including a socket 110 for retaining a memory module 116. FIG. 1B is a side view of a functional block diagram of device 100 including circuit board 102 including socket 110 for retaining memory module 116.

Circuit board 102 may be, or may include, a support structure for physically coupling one or more electronic components. Further, circuit board 102 may be, or may include, an interconnection providing for electrical (and/or communicative) coupling between the one or more electronic components. Circuit board 102 may include multiple layers of non-conductive material which may be interleaved with multiple layers of conductive material. In some embodiments, circuit board 102 may be, or may include, a printed circuit board (PCB).

For example, circuit board 102 may include a processor slot for receiving a processor 104, and in some embodiments, circuit board 102 may include processor 104. Circuit board 102 may physically retain processor 104 within the processor slot. The processor slot may include contacts for pins of processor 104. Circuit board 102 may include electrically conductive lines to electrically (and/or communicatively) couple the pins of processor 104 to other electronic components. For example, circuit board 102 may include electrically conductive lines to provide power to processor 104, e.g., from a power source electrically coupled to circuit board 102. As another example, circuit board 102 may include electrically conductive lines to variously electrically couple pins of processor 104 to pins of ports (not illustrated in FIG. 1A), e.g., to allow processor 104 to send and/or receive messages from other systems or devices via the ports. Circuit board 102 may further include heat sinks to allow heat from processor 104 (and/or other electronic components) to dissipate into surrounding air.

Memory module 116 may include one or more memory devices 120 on a circuit board 118. Memory devices 120 may be, or may include, memory chips. Memory module 116 may include additional components, for example, memory controllers, passive devices (including, e.g., resistors and/or capacitors), active devices (including, e.g., controllers, power regulation, identification, multiplexers, and/or buffers).

Similar to circuit board 102, circuit board 118 may be, or may include, a support structure for physically retaining memory devices 120 and an interconnection providing for electrical coupling of memory devices 120. In some embodiments, circuit board 118 may be a PCB.

Memory module 116 may include a connector portion 126. Connector portion 126 may be for physically and electrically coupling memory module 116 to socket 110. Thus, connector portion 126 may include a structural-connection portion 128 (e.g., a rigid non-conductive material) to be retained within socket 110. The connector portion 126 may also include electrical contacts 130 arranged on the structural-connection portion 128 to provide for electrical coupling, e.g., within socket 110. Circuit board 118 may include electrically conductive lines for electrically connecting pins of various memory devices 120 to electrical contacts 130 of connector portion 126.

Socket 110 of circuit board 102 may provide for coupling between memory modules 116 and circuit board 102. Socket 110 may retain memory modules 116 in a receiver portion 112. Further, socket 110 may include electrically conductive lines 114 which may provide for electrical coupling between electrical contacts 130 of memory devices 120 and electronic components of circuit board 102.

Socket 110 may retain memory module 116 extending from circuit board 102 in a plane 133, which plane 133 may be perpendicular to a plane 132 of the circuit board 102. For example, a surface 106 (e.g., a major surface, e.g., a top surface) of circuit board 102 may be in plane 132. A surface 122 (e.g., a major surface, e.g., a top surface) of memory module 116 may be in plane 133. Plane 133 may be perpendicular to plane 132.

In some situations, memory module 116 extending perpendicularly from circuit board 102 may be advantageous to allow for air flow for allowing heat to transfer from memory module 116 and/or circuit board 102 effectively. However, memory module 116 extending perpendicularly from circuit board 102 may cause circuit board 102 (including memory module 116) to be tall (e.g., in the dimension perpendicular to plane 132). Such height may be a disadvantage in some situations.

Various embodiments disclosed herein include a circuit board, wherein a surface of the circuit board (e.g., a major surface, e.g., a top surface) is in a first plane. The various embodiments may include a memory module electrically coupled to the circuit board, wherein a surface (e.g., a major surface, e.g., a top surface) of the memory module is in a second plane, the second plane substantially parallel to the first plane. In some embodiments, the first plane and the second plane may be the same plane.

Additionally or alternatively, in various embodiments disclosed herein, the memory module may extend in a direction substantially parallel to the first plane, from a side of the circuit board. The side of the first circuit board may be substantially perpendicular to the surface of the circuit board. Additionally or alternatively, in various embodiments disclosed herein, the memory module may extend, in a direction substantially in the first plane, beyond a footprint of the circuit board.

Additionally or alternatively, various embodiments include interfaces to allow a memory module to be electrically and/or physically coupled to a circuit board while the memory module is in a plane that is parallel to a plane of the circuit board. Additionally or alternatively, various embodiments may include circuit boards including interfaces to allow a memory module to be electrically and/or physically coupled to a circuit board while the memory module is in a plane that is parallel to a plane of the circuit board. Additionally or alternatively, various embodiments may include memory modules including interfaces to allow a memory module to be electrically and/or physically coupled to a circuit board while the memory module is in a plane that is parallel to a plane of the circuit board.

Various embodiments disclosed herein may have advantages compared with device 100 of FIG. 1A and FIG. 1B. For example, various embodiments may be shorter, e.g., in a dimension perpendicular to plane 132 than device 100 is, e.g., in a dimension perpendicular to plane 132. The relative shortness of the various embodiments may be advantageous because, for example, the relative shortness may allow more instances of various embodiments to be stacked into a space than instances of device 100 may be stacked into the same space. For example, more instances of various embodiments may be stacked into a volume within an immersion server than instances of device 100 may be stacked into the same volume within the immersion server. Various embodiments may be, or may be included in, a card for an immersion server.

Instances of various embodiments may be useful in an immersion server at least in part because in an immersion server, heat transfer may be effected by a liquid (in which the instances of various embodiments are immersed) which may transfer heat more efficiently than air transfers heat. The liquid of such immersion servers may be expensive. Thus, reducing an unused volume within an immersion server may be advantageous. It may be possible to stack instances of various embodiments more tightly in an immersion server than instances of device 100 can be stacked in the immersion server, which may save on unused volume within the immersion server.

Additionally or alternatively, instances of various embodiments may be suitable for thin applications (e.g., flat-panel displays, handheld computing devices, tablet computers, laptops, or all-in-one desktop computers). Additionally or alternatively, instances of various embodiments (e.g., combined circuit boards and memory modules) may be simpler and/or cheaper to package, e.g., for shipping and/or sales, than instances of device 100. Additionally or alternatively, various embodiments may be less expensive than conventional circuit boards and/or memory modules. Additionally or alternatively, various embodiments may be used in automotive, edge, and/or embedded systems.

Figure 2A:
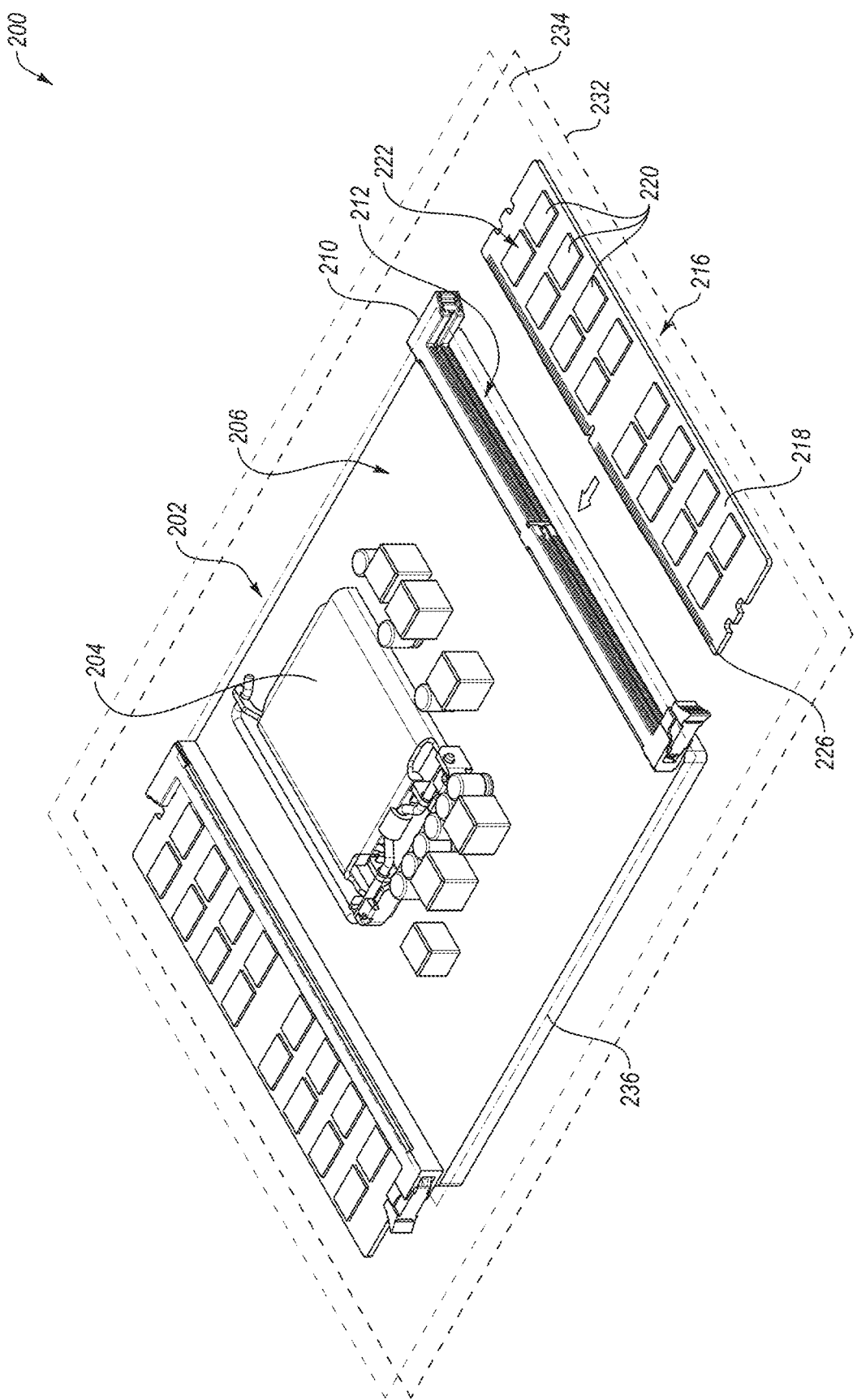
FIG. 2A is a perspective view of a functional block diagram illustrating an example device in accordance with at least one embodiment of the disclosure.
Figure 2B:
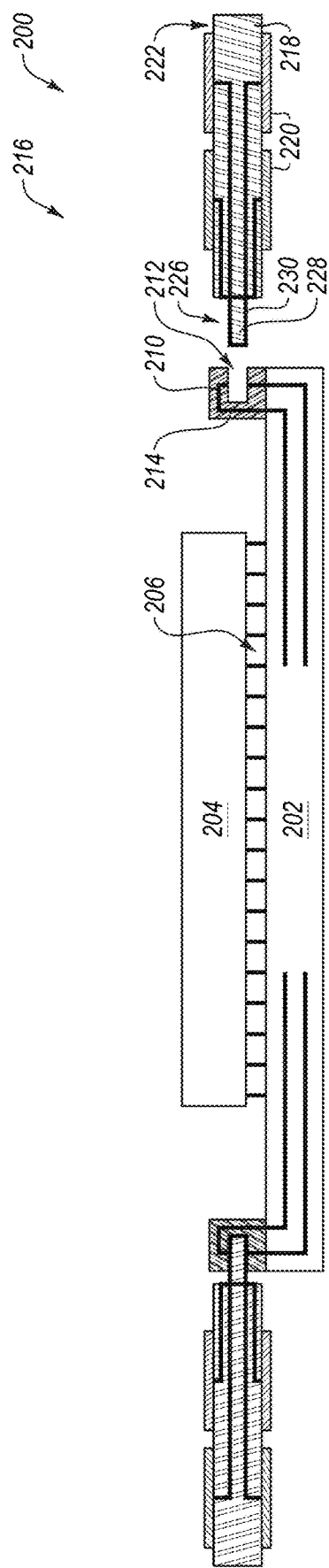
FIG. 2B is a side view of a functional block diagram illustrating the device of FIG. 2A in accordance with at least one embodiment of the disclosure.

FIG. 2A is a perspective view of a functional block diagram illustrating an example device 200 in accordance with at least one embodiment of the disclosure. FIG. 2B is a side view of a functional block diagram illustrating device 200 in accordance with at least one embodiment of the disclosure.

In some embodiments, device 200 may include a circuit board 202. A surface 206 (e.g., a major surface, e.g., a top surface) of circuit board 202 may be in a plane 232. Device 200 may include a memory module 216 to be electrically coupled to circuit board 202. A surface 222 (e.g., a major surface, e.g., a top surface) of memory module 216 may be in a plane 234. Plane 234 may be substantially parallel to plane 232. The circuit board 202 also includes a processor slot for receiving a processor 204.

In FIGS. 1A through 11B, elements having the same last two digits as corresponding elements of others of FIGS. 1A through 11B may be the same as or substantially similar to the corresponding elements, unless explicitly stated otherwise. For example, memory module 216 may be the same as or substantially similar to memory module 116 of FIG. 1A and FIG. 1B. As another example, processors 204, 304, and 404 may be the same as or substantially similar to processor 104 of FIGS. 1A and 1B. In addition, circuit board 218 may be the same as or substantially similar to circuit board 118 of FIGS. 1A and 1B. As a further example, footprint 436 may be the same as or substantially similar to footprint 236 of FIG. 2A.

A difference between device 200 and device 100 of FIG. 1A and FIG. 1B is that a socket 210 of device 200 retains memory module 216, including circuit board 218, in plane 234 that is parallel to plane 232 of surface 206. A receiver portion 212 of socket 210 may physically retain connector portion 226 of memory module 216 in plane 234. Receiver portion 212 of socket 210 may be the same as or substantially similar to receiver portion 112 of socket 110 of FIG. 1A and FIG. 1B but rotated substantially 90°. Electrically conductive lines 214 may be similar to electrically conductive lines 114 of FIG. 1A and FIG. 1B, but electrically conductive lines 214 may include a substantially 90° bend or corner. Socket 210 may be physically and electrically coupled to surface 206 of circuit board 202 in much the same way socket 110 is physically and electrically coupled to surface 106.

Similar to what was described above with regard to socket 110 of FIG. 1A and FIG. 1B, socket 210 may include receiver portion 212 for receiving connector portion 226 of memory module 216. Socket 210 may include a number of electrically conductive lines 214 within receiver portion 212. The number of electrically conductive lines 214 may be for electrically coupling memory module 216 to circuit board 202. Connector portion 226 of memory module 216 may include structural-connection portion 228 to be retained within receiver portion 212. Connector portion 226 of memory module 216 may include a number of electrical contacts 230 arranged on structural-connection portion 228. Each of electrical contacts 230 may be electrically coupled with a corresponding one of the number of electrically conductive lines 214 of socket 210.

Some embodiments may include circuit board 202 and memory module 216. As noted above, memory module 216 may be electrically coupled to circuit board 202 at socket 210 on surface 206 of circuit board 202.

Some embodiments may include circuit board 202 in which surface 206 of circuit board 202 is in plane 232. Such embodiments may include an interface (e.g., socket 210) for electrically coupling circuit board 202 to memory module 216. As noted above, surface 222 of memory module 216 may be in plane 234, which plane 234 may be substantially parallel to plane 232 when memory module 216 is electrically coupled to circuit board 202. In some embodiments, the interface may be, or may include, socket 210 on surface 206 of circuit board 202.

Some embodiments may include socket 210 for electrically coupling memory module 216 to circuit board 202. As noted above, surface 206 of circuit board 202 may be in plane 232. Surface 222 of memory module 216, while electrically coupled to circuit board 202, may be in plane 234, which may be substantially parallel to plane 232. In some embodiments, socket 210 may be on surface 206 of circuit board 202.

In FIGS. 2A through 11B, two memory modules and two sockets are illustrated for illustrative purposes. Device 200 may include any number of memory modules and/or any number of sockets. Elements and functions labeled and described with respect to memory module 216 may apply to other memory modules whether illustrated or not. Similarly, elements and functions labeled and described with respect to one interface (e.g., socket and/or connection portion) may apply to other interfaces whether illustrated or not.

In FIGS. 2A through 11B, one of two illustrated memory modules is illustrated as electrically coupled to the respective circuit board and the other of the two memory modules is illustrated as separate from the respective circuit board for illustrative purposes. In contemplated operation of embodiments, memory modules may be electrically coupled to their respective circuit boards.

In FIGS. 2A through 11B, one of the memory modules, (e.g., memory module 216) extends, in a direction substantially in plane 232, beyond footprint 236 of circuit board 202. The other memory module (not labeled) is illustrated as extending in another direction substantially in plane 232, beyond footprint 236 of circuit board 202.

Figure 3A:
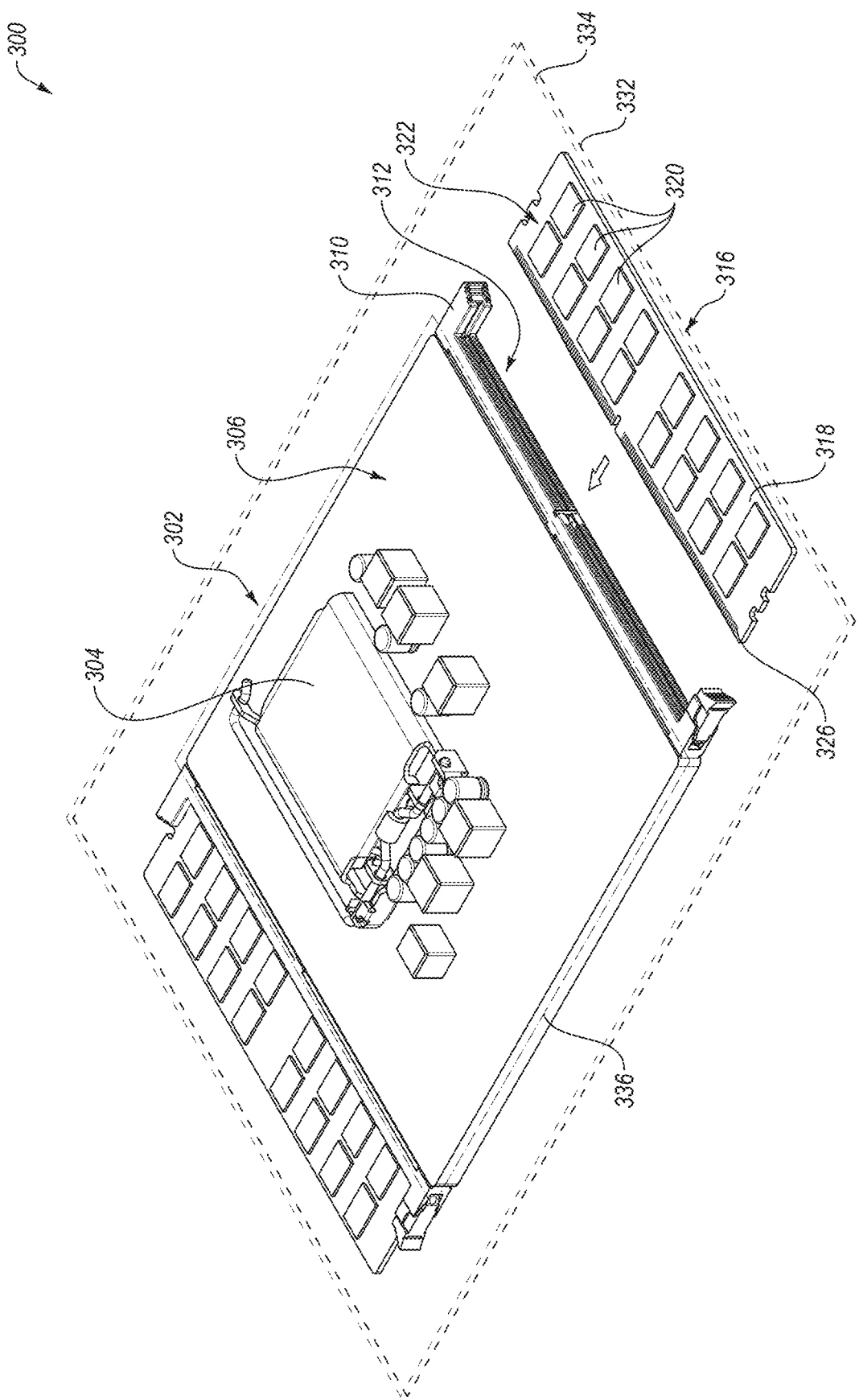
FIG. 3A is a perspective view of a functional block diagram illustrating another example device in accordance with at least one embodiment of the disclosure.
Figure 3B:
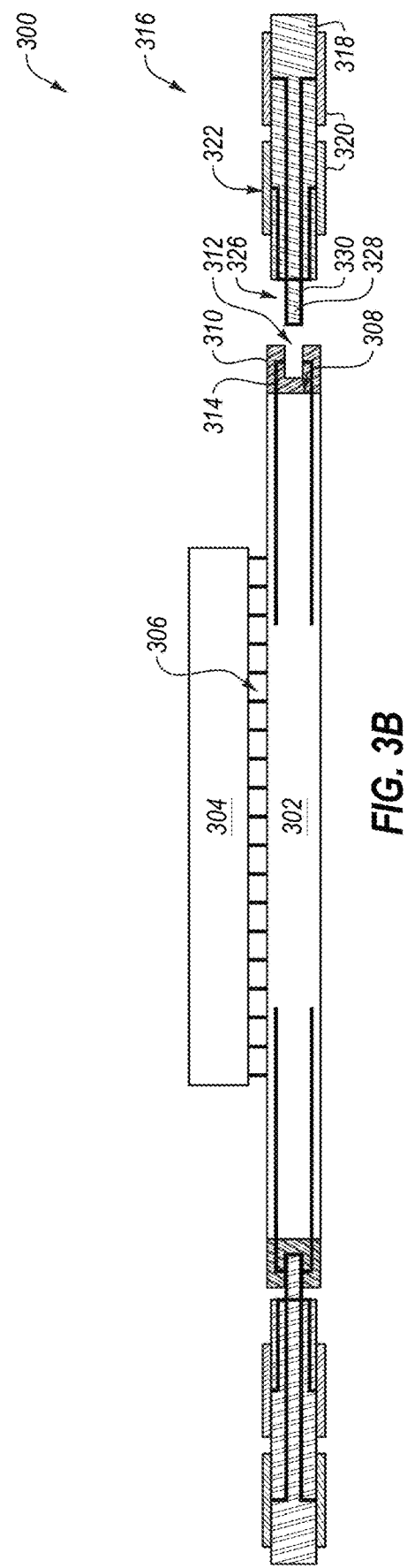
FIG. 3B is a side view of a functional block diagram illustrating the device of FIG. 3A in accordance with at least one embodiment of the disclosure.

FIG. 3A is a perspective view of a functional block diagram illustrating another example device 300 in accordance with at least one embodiment of the disclosure. FIG. 3B is a side view of a functional block diagram illustrating device 300 in accordance with at least one embodiment of the disclosure.

Device 300 may include a circuit board 302 which may include a processor 304. A surface 306 (e.g., a major surface, e.g., a top surface) of circuit board 302 may be in a plane 332. Device 300 may include a memory module 316 to be electrically coupled to circuit board 302. A surface 322 (e.g., a major surface, e.g., a top surface) of memory module 316 may be in a plane 334. Plane 334 may be substantially parallel to plane 332. Memory module 316 may extend, in a direction substantially parallel to plane 332, from side 308 of circuit board 302, beyond footprint 336 of circuit board 302. Side 308 of circuit board 302 may be substantially perpendicular to surface 306.

A difference between device 300 and device 100 of FIG. 1A and FIG. 1B and device 200 of FIG. 2A and FIG. 2B is that a socket 310 of device 300 is on side 308 of circuit board 302. Socket 310 may retain memory module 316 in plane 334 parallel to surface 306. Thus, a receiver portion 312 of socket 310 may physically retain a connector portion 326 of memory module 316 in plane 334. Receiver portion 312 of socket 310 may be the same as or substantially similar to receiver portion 112 of socket 110 of FIG. 1A and FIG. 1B but rotated substantially 90°. Electrically conductive lines 314 may be similar to electrically conductive lines 114 of FIG. 1A and FIG. 1B.

Socket 310 may be physically coupled to side 308 of circuit board 302 rather than to surface 306. Such a difference in coupling may, or may not, require differences in how socket 310 is physically coupled to circuit board 302 compared with how socket 210 is physically coupled to surface 206. For example, socket 310 may be glued or epoxied to side 308 of circuit board 302. Additionally or alternatively, socket 310 may include extensions on surface 306 and an opposite side of circuit board 302. The electrical coupling between socket 310 and circuit board 302 may require changes in or on a surface of circuit board 302 (relative to circuit board 102 of FIG. 1A and FIG. 1B). For example, circuit board 302 may be designed to include contacts or electrically conductive lines at side 308 of circuit board 302.

Some embodiments may include circuit board 302 and memory module 316. As noted above, circuit board 302 may include side 308, which may be substantially perpendicular to surface 306. Memory module 316 may be electrically coupled to circuit board 302 at socket 310 on side 308 of circuit board 302.

Some embodiments may include circuit board 302 in which surface 306 of circuit board 302 is in plane 332. Such embodiments may include an interface (e.g., socket 310) for electrically coupling circuit board 302 to memory module 316. As noted above, surface 322 of memory module 316 may be in plane 334, which may be substantially parallel to plane 332 when memory module 316 is electrically coupled to circuit board 302. In some embodiments, circuit board 302 may include side 308, which may be substantially perpendicular to surface 306. The interface may be, or may include, socket 310 on side 308 of circuit board 302.

Some embodiments may include socket 310 for electrically coupling memory module 316 to circuit board 302. As noted above, surface 306 of circuit board 302 may be in plane 332. Surface 322 of memory module 316, while electrically coupled to circuit board 302, may be in plane 334, which may be substantially parallel to plane 332. In some embodiments, socket 310 is to be at side 308 of circuit board 302. Side 308 of circuit board 302 may be substantially perpendicular to surface 306 of circuit board 302.

Figure 4A:
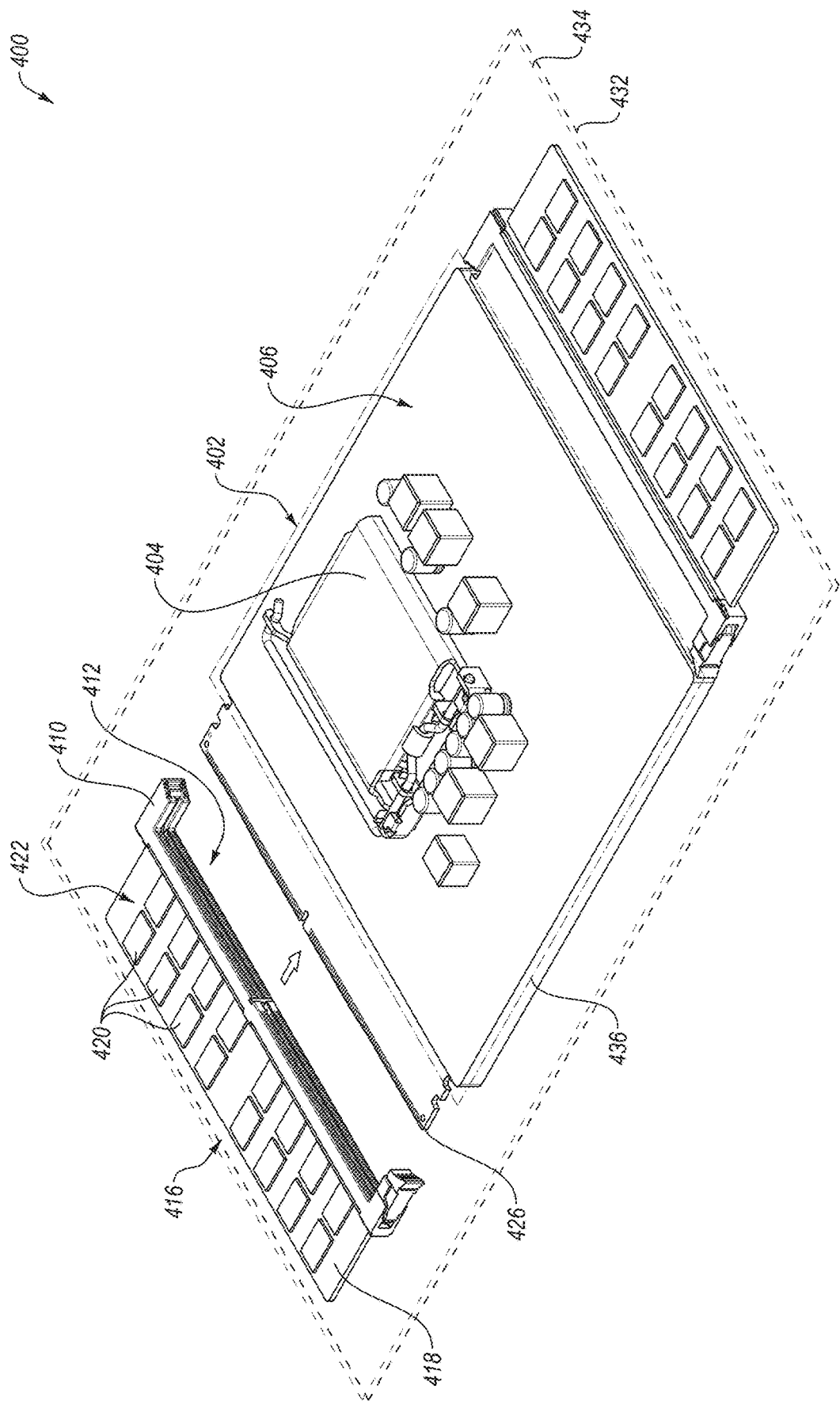
FIG. 4A is a perspective view of a functional block diagram illustrating another example device in accordance with at least one embodiment of the disclosure.
Figure 4B:
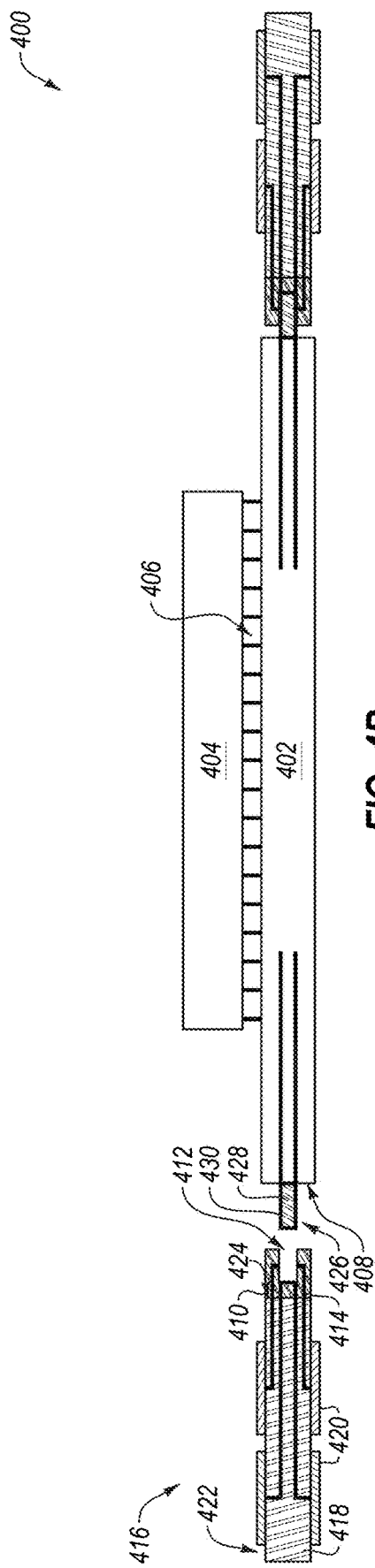
FIG. 4B is a side view of a functional block diagram illustrating the device of FIG. 4A in accordance with at least one embodiment of the disclosure.

FIG. 4A is a perspective view of a functional block diagram illustrating another example device 400 in accordance with at least one embodiment of the disclosure. FIG. 4B is a side view of a functional block diagram illustrating device 400 in accordance with at least one embodiment of the disclosure.

Device 400 may include a circuit board 402 which may include a processor 404. A surface 406 (e.g., a major surface, e.g., a top surface) of circuit board 402 may be in a plane 432. Device 400 may include a memory module 416 to be electrically coupled to circuit board 402. A surface 422 (e.g., a major surface, e.g., a top surface) of memory module 416 may be in a plane 434. Plane 434 may be substantially parallel to plane 432. Memory module 416 may extend, in a direction substantially parallel to plane 432, from side 408 of circuit board 402 beyond footprint 436 of circuit board 402. Side 408 of circuit board 402 may be substantially perpendicular to surface 406.

A difference between device 400 and device 100 of FIG. 1A and FIG. 1B, device 200 of FIG. 2A and FIG. 2B, and device 300 of FIG. 3A and FIG. 3B is that a socket 410 of device 400 is on side 424 of memory module 416 rather than on circuit board 402. Further, a connector portion 426 is on side 408 of circuit board 402 rather than on memory module 416. Side 424 may be substantially perpendicular to surface 422.

Socket 410 may be the same as or substantially similar to socket 310 of FIG. 3A and FIG. 3B, but socket 410 may be on memory module 416 whereas socket 310 is on circuit board 302. Socket 410 may include a receiver portion 412 for receiving and retaining connector portion 426 of circuit board 402. Because, as an example, circuit board 402 may be larger than memory module 416, socket 410 (including receiver portion 412) may retain memory module 416 relative to circuit board 402 even though socket 410 (including receiver portion 412) retains connector portion 426 of circuit board 402. Socket 410 may include electrically conductive lines 414 which may electrically couple memory devices 420 to circuit board 402.

Socket 410 of memory module 416 may require changes in or on a surface of memory module 416 (relative to memory module 116 of FIG. 1A and FIG. 1B). For example, memory module 416 may be designed to include electrical contacts and/or electrically conductive lines 414 at side 424 of memory module 416.

Connector portion 426 may be the same as or substantially similar to connector portion 326 of FIG. 3A and FIG. 3B, but connector portion 426 may be on circuit board 402 whereas connector portion 326 is on memory module 316. Connector portion 426 may include a structural-connection portion 428 which may be retained by receiver portion 412. Connector portion 426 may include electrical contacts 430 which may provide for electrical coupling between circuit board 402 and memory module 416.

Electrical contacts 430 of connector portion 426 may require changes in or on a surface of circuit board 402 (relative to circuit board 102 of FIG. 1A and FIG. 1B). For example, circuit board 402 may be designed to include electrical contacts 430 and/or electrically conductive lines at side 408 of circuit board 402.

Some embodiments may include memory module 416 and circuit board 402. As noted above, memory module 416 may be electrically coupled to circuit board 402 at socket 410 on side 424 of memory module 416. Side 424 of memory module 416 may be substantially perpendicular to surface 422 of memory module 416.

Some embodiments may include memory module 416 including an interface (e.g., socket 410) for electrically coupling memory module 416 to circuit board 402. As noted above, surface 406 of circuit board 402 may be in plane 432. Memory module 416 may include circuit board 418. Circuit board 418 may include surface 422, which may be in plane 434. Plane 434, when memory module 416 is electrically coupled to circuit board 402, may be substantially parallel to plane 432. In some embodiments, circuit board 402 may include side 408, which may be substantially perpendicular to surface 406. The interface may be, or may include, socket 410 at side 424 of memory module 416. Side 424 of memory module 416 may be substantially perpendicular to surface 422 of memory module 416.

Some embodiments may include circuit board 402 in which surface 406 of circuit board 402 may be in plane 432. Such embodiments may include an interface (e.g., connector portion 426) for electrically coupling circuit board 402 to memory module 416. As noted above, surface 422 of memory module 416 may be in plane 434, which may be substantially parallel to plane 432 when memory module 416 is electrically coupled to circuit board 402. In some embodiments, circuit board 402 comprises side 408, which may be substantially perpendicular to surface 406. The interface may be at side 408 of circuit board 402. The interface may be, or may include, connector portion 426.

Some embodiments may include socket 410 for electrically coupling memory module 416 to circuit board 402. As noted above, surface 406 of circuit board 402 may be in plane 432. Surface 422 of memory module 416 may be in plane 434, which may be substantially parallel to plane 432 when memory module 416 is electrically coupled to circuit board 402. Socket 410 may be for receiving connector portion 426 of circuit board 402, wherein connector portion 426 may be at side 408 of circuit board 402. Side 408 of circuit board 402 may be substantially perpendicular to surface 406. Socket 410 may be at side 424 of memory module 416. Side 424 may be substantially perpendicular to surface 422.

Figure 5A:
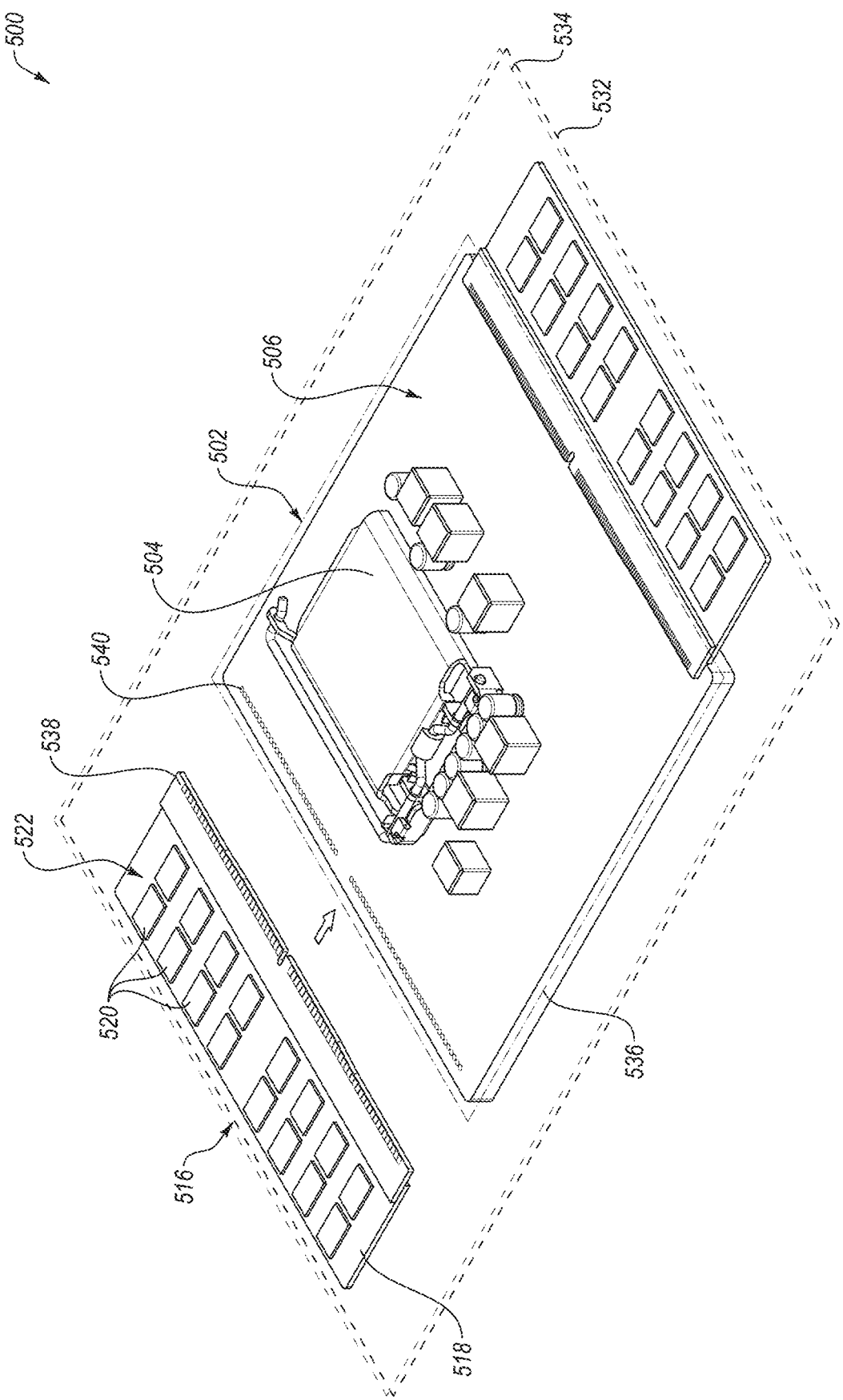
FIG. 5A is a perspective view of a functional block diagram illustrating another example device in accordance with at least one embodiment of the disclosure.
Figure 5B:
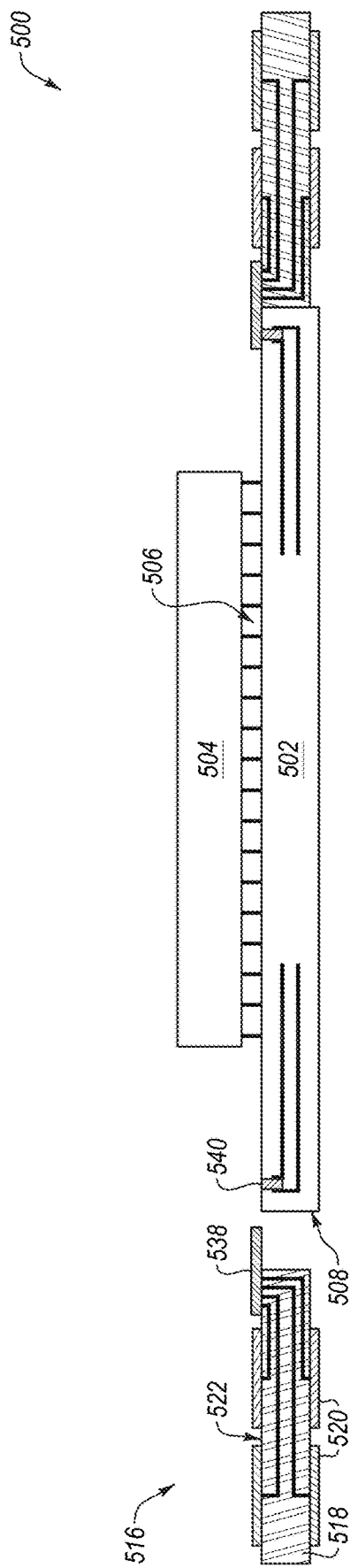
FIG. 5B is a side view of a functional block diagram illustrating the device of FIG. 5A in accordance with at least one embodiment of the disclosure.

FIG. 5A is a perspective view of a functional block diagram illustrating another example device 500 in accordance with at least one embodiment of the disclosure. FIG. 5B is a side view of a functional block diagram illustrating device 500 in accordance with at least one embodiment of the disclosure.

Device 500 may include a circuit board 502. A surface 506 (e.g., a major surface, e.g., a top surface) of circuit board 502 may be in a plane 532. Device 500 may include a memory module 516 to be electrically coupled to circuit board 502. A surface 522 (e.g., a major surface, e.g., a top surface) of memory module 516 may be in a plane 534. Plane 534 may be substantially parallel to plane 532. Memory module 516 may extend, in a direction substantially parallel to plane 532, from side 508 of circuit board 502. Side 508 of circuit board 502 may be substantially perpendicular to surface 506.

A difference between device 500 and device 100 of FIG. 1A and FIG. 1B, device 200 of FIG. 2A and FIG. 2B, device 300 of FIG. 3A and FIG. 3B, and device 400 of FIG. 4A and FIG. 4B is that device 500 may not include a socket. Rather, electrically conductive lines 538 may directly electrically couple memory module 516 to circuit board 502. For example, electrically conductive lines 538 may extend from surface 522 of memory module 516 to surface 506 of circuit board 502. More specifically, electrically conductive lines 538 may extend from surface 522 to pads/vias 540 of circuit board 502. Electrically conductive lines 538 may be electrically coupled (e.g., soldered to pads or inserted into vias).

Electrically conductive lines 538 may be, or may include, electrically conductive lines substantially similar to other electrically conductive lines described herein. Additionally or alternatively, electrically conductive lines 538 may be made from a more rigid conductive material than the other electrically conductive lines described herein. Additionally or alternatively, electrically conductive lines 538 may be thicker (in one or more dimensions) than other electrically conductive lines described herein.

In some embodiments, electrically conductive lines 538 may be arranged on a non-conductive supporting material e.g., one or more layers of PCB. In some embodiments, electrically conductive lines 538 may be at least partially sheathed or clad in a non-conductive material, e.g., to isolate electrically conductive lines 538 from each other and/or to provide strength to the physical connection between memory module 516 and circuit board 502.

Pads/vias 540 may be, or may include, pads e.g., electrically conductive landing pads electrically coupled to electrically conductive lines on or within circuit board 502. In some embodiments, electrically conductive lines 538 may be soldered to pads/vias 540. Additionally or alternatively, pads/vias 540 may be, or may include, vias, e.g., extending at least partially into circuit board 502 and electrically coupled to electrically conductive lines on or within circuit board 502. In some embodiments, electrically conductive lines 538 may include pins that may be inserted into vias of pads/vias 540.

Some embodiments may include memory module 516 including electrically conductive lines 538 extending from surface 522 of memory module 516 to surface 506 of circuit board 502 to provide for electrical coupling between circuit board 502 and memory module 516. In some embodiments, electrically conductive lines 538 may electrically couple to pads (e.g., of pads/vias 540) on surface 506 of circuit board 502. Additionally or alternatively, electrically conductive lines 538 may electrically couple to vias (e.g., of pads/vias 540) in surface 506 of circuit board 502.

Some embodiments may include memory module 516 including an interface (e.g., electrically conductive lines 538) for electrically coupling memory module 516 to circuit board 502. As noted above, surface 506 of circuit board 502 may be in plane 532. Memory module 516 may include circuit board 518, which may include surface 522. Surface 522 may be in plane 534. Plane 534, when memory module 516 is electrically coupled to circuit board 502, may be substantially parallel to plane 532. In some embodiments, memory module 516 further comprises electrically conductive lines 538 extending from surface 522 of memory module 516 to surface 506 of circuit board 502 to provide for electrical coupling between circuit board 502 and memory module 516.

Figure 6A:
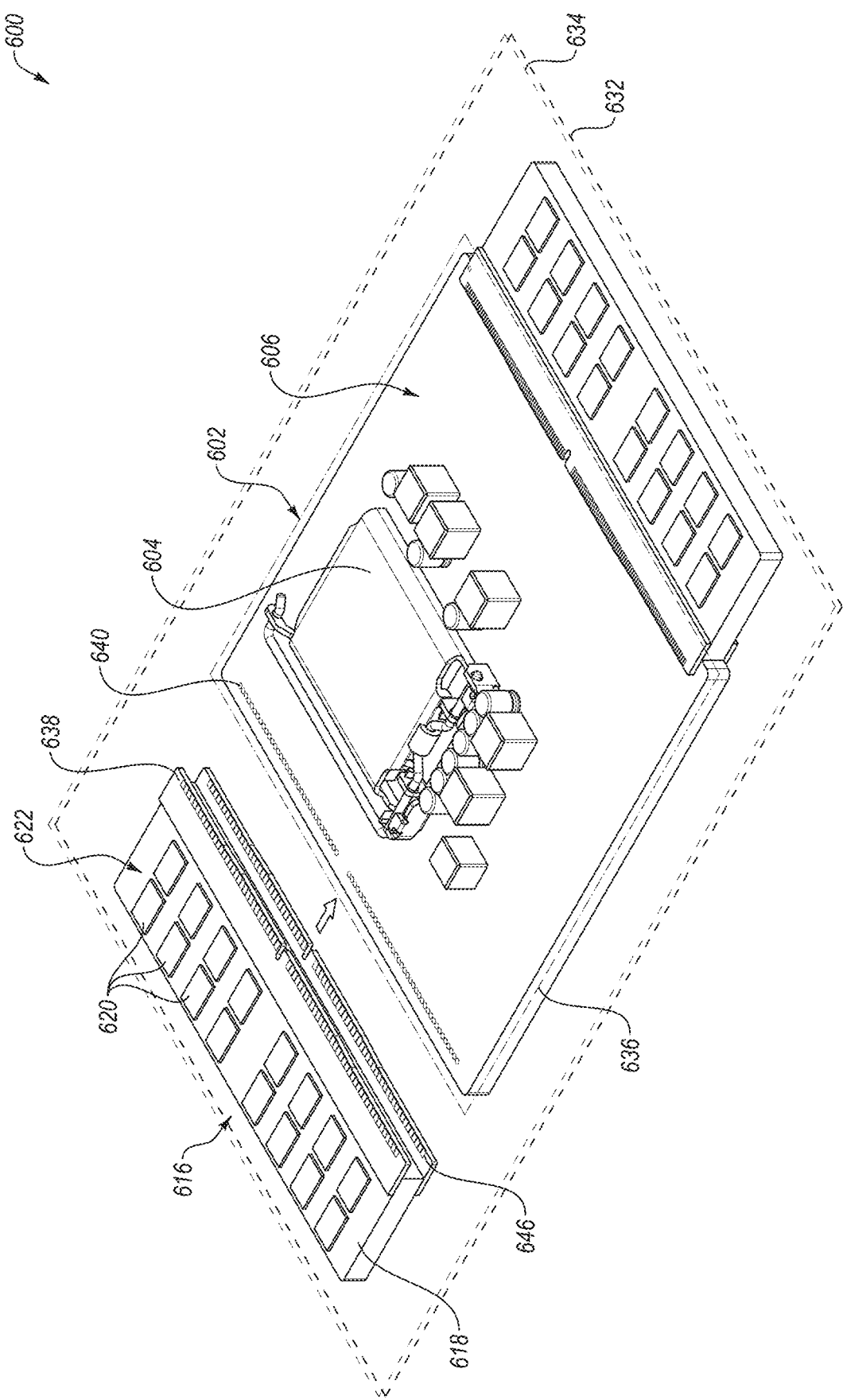
FIG. 6A is a perspective view of a functional block diagram illustrating another example device in accordance with at least one embodiment of the disclosure.

FIG. 6A is a perspective view of a functional block diagram illustrating another example device 600 in accordance with at least one embodiment of the disclosure. FIG. 6B is a side view of a functional block diagram illustrating device 600 in accordance with at least one embodiment of the disclosure.

Device 600 may include a circuit board 602. A surface 606 (e.g., a major surface, e.g., a top surface) of circuit board 602 may be in a plane 632. Device 600 may include a memory module 616 to be electrically coupled to circuit board 602. A surface 622 (e.g., a major surface, e.g., a top surface) of memory module 616 may be in a plane 634.

Plane 634 may be substantially parallel to plane 632. Memory module 616 may extend, in a direction substantially parallel to plane 632, from side 608 of circuit board 602. Side 608 of circuit board 602 may be substantially perpendicular to surface 606.

Device 600 may be the same as or substantially similar to device 500 of FIG. 5A and FIG. 5B, with the addition of electrically conductive lines 646, extending from a surface 644 (e.g., a major surface, e.g., a bottom surface) of memory module 616 to pads/vias 648 on a surface 642 (e.g., a major surface, e.g., a bottom surface) of circuit board 602. Surface 644 of memory module 616 may be opposite surface 622 of memory module 616. Surface 642 of circuit board 602 may be opposite surface 606 of circuit board 602. Electrically conductive lines 646 may be the same as or substantially similar to electrically conductive lines 538 of FIG. 5A and FIG. 5B. Pads/vias 648 may be the same as or substantially similar to pads/vias 540 of FIG. 5A and FIG. 5B.

In some embodiments (not illustrated in FIG. 6A and FIG. 6B), vias of pads/vias 640 may extend through circuit board 602 to vias of pads/vias 648. In other embodiments, pads/vias 640 and pads/vias 648 may not extend completely through circuit board 602.

Some embodiments may include memory module 616 including an interface (e.g., electrically conductive lines 638 and/or electrically conductive lines 646) for electrically coupling memory module 616 to circuit board 602. As noted above, surface 606 of circuit board 602 may be in plane 632. Memory module 616 may include circuit board 618, which may include surface 622. Surface 622 may be in plane 634. Plane 634, when memory module 616 is electrically coupled to circuit board 602, may be substantially parallel to plane 632. In some embodiments, memory module 616 may include electrically conductive lines 638 extending from surface 622 of memory module 616 to surface 606 of circuit board 602 to provide for electrical coupling between circuit board 602 and memory module 616.

Figure 7A:
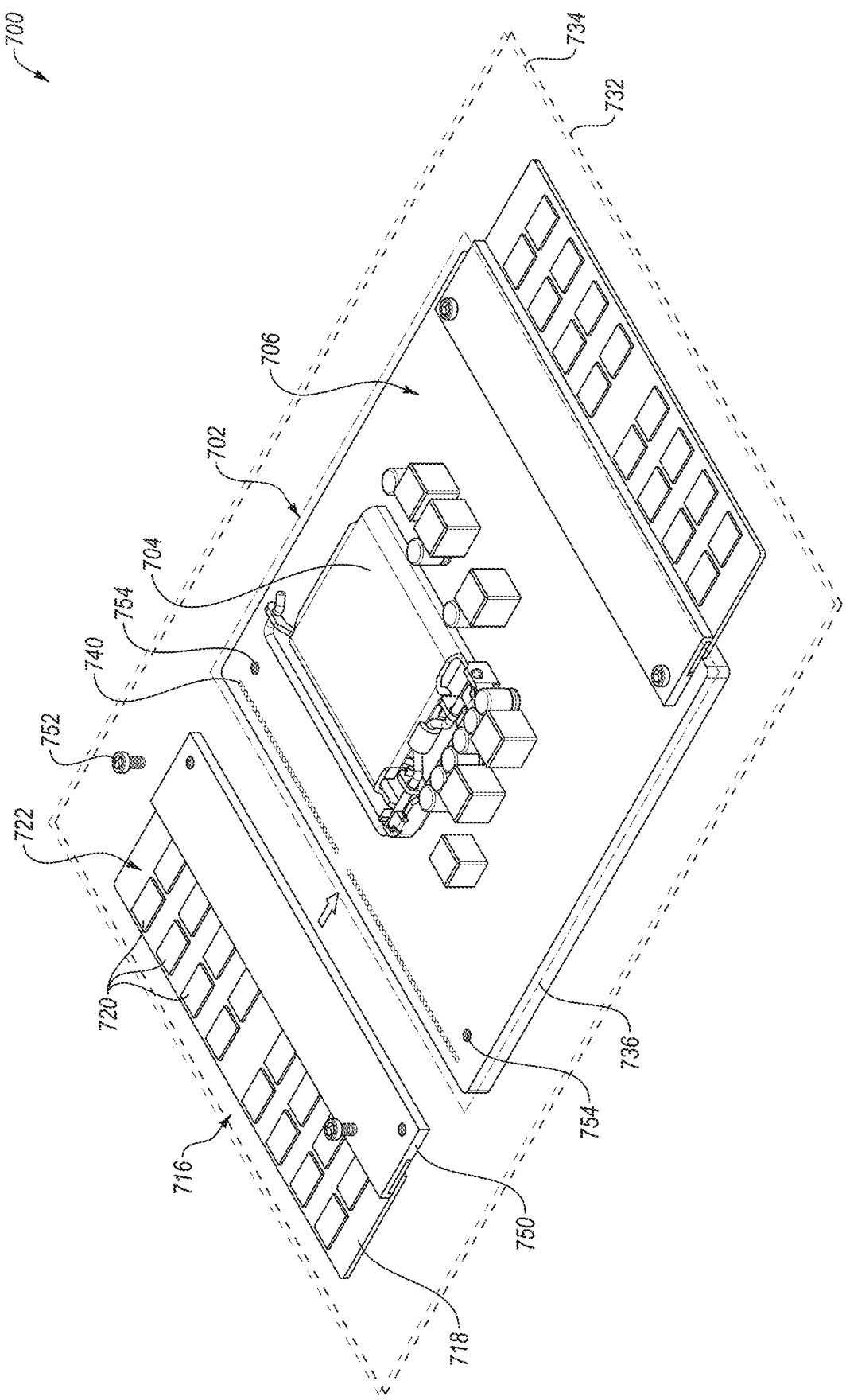
FIG. 7A is a perspective view of a functional block diagram illustrating another example device in accordance with at least one embodiment of the disclosure.
Figure 7B:
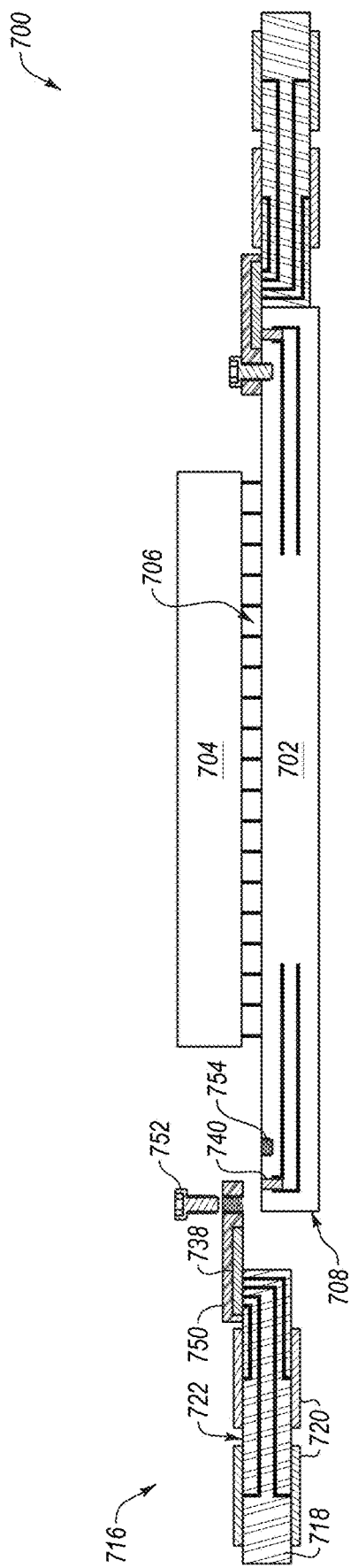
FIG. 7B is a side view of a functional block diagram illustrating the device of FIG. 7A in accordance with at least one embodiment of the disclosure.

FIG. 7A is a perspective view of a functional block diagram illustrating another example device 700 in accordance with at least one embodiment of the disclosure. FIG. 7B is a side view of a functional block diagram illustrating device 700 in accordance with at least one embodiment of the disclosure.

Device 700 may include a circuit board 702. A surface 706 (e.g., a major surface, e.g., a top surface) of circuit board 702 may be in a plane 732. Device 700 may include a memory module 716 to be electrically coupled to circuit board 702. A surface 722 (e.g., a major surface, e.g., a top surface) of memory module 716 may be in a plane 734. Plane 734 may be substantially parallel to plane 732. Memory module 716 may extend, in a direction substantially parallel to plane 732, from side 708 of circuit board 702. Side 708 of circuit board 702 may be substantially perpendicular to surface 706.

Device 700 may be the same as or substantially similar to device 500 of FIG. 5A and FIG. 5B, with the addition of support member 750, which may extend between surface 722 of memory module 716 and surface 706 of circuit board 702. Support member 750 may physically connect memory module 716 to circuit board 702 and may retain memory module 716 relative to circuit board 702. For example, support member 750 may be secured to surface 706 of circuit board 702 to physically attach the memory module 716 to circuit board 702.

In some embodiments, electrically conductive lines 738 may be on support member 750. In some embodiments, support member 750 may electrically isolate electrically conductive lines 738 from each other. For example, support member 750 may surround at least a portion of electrically conductive lines 738.

In some embodiments, support member 750 may include a securing member 752. Securing member 752 may serve to retain memory module 716 relative to circuit board 702. Securing member 752 may be, or may include, for example, a screw, a pin, or a clip.

In some embodiments, circuit board 702 may include a hole 754 to be coupled to securing member 752. Securing member 752 may serve to allow securing member 752 to couple memory module 716 to circuit board 702 without damaging circuit board 702. Hole 754 may be, or may include, for example, a slot, hole, or groove for a screw, pin, or clip.

Some embodiments may include memory module 716 including an interface (e.g., electrically conductive lines 738 and/or support member 750) for electrically coupling memory module 716 to circuit board 702. As noted above, surface 706 of circuit board 702 may be in plane 732. Memory module 716 may include a circuit board 718, which may include surface 722. Surface 722 may be in plane 734. Plane 734, when memory module 716 is electrically coupled to circuit board 702, may be substantially parallel to plane 732. In some embodiments, memory module 716 further comprises electrically conductive lines 738 extending from surface 722 of memory module 716 to surface 706 of circuit board 702 to provide for electrical coupling between circuit board 702 and memory module 716.

Figure 8A:
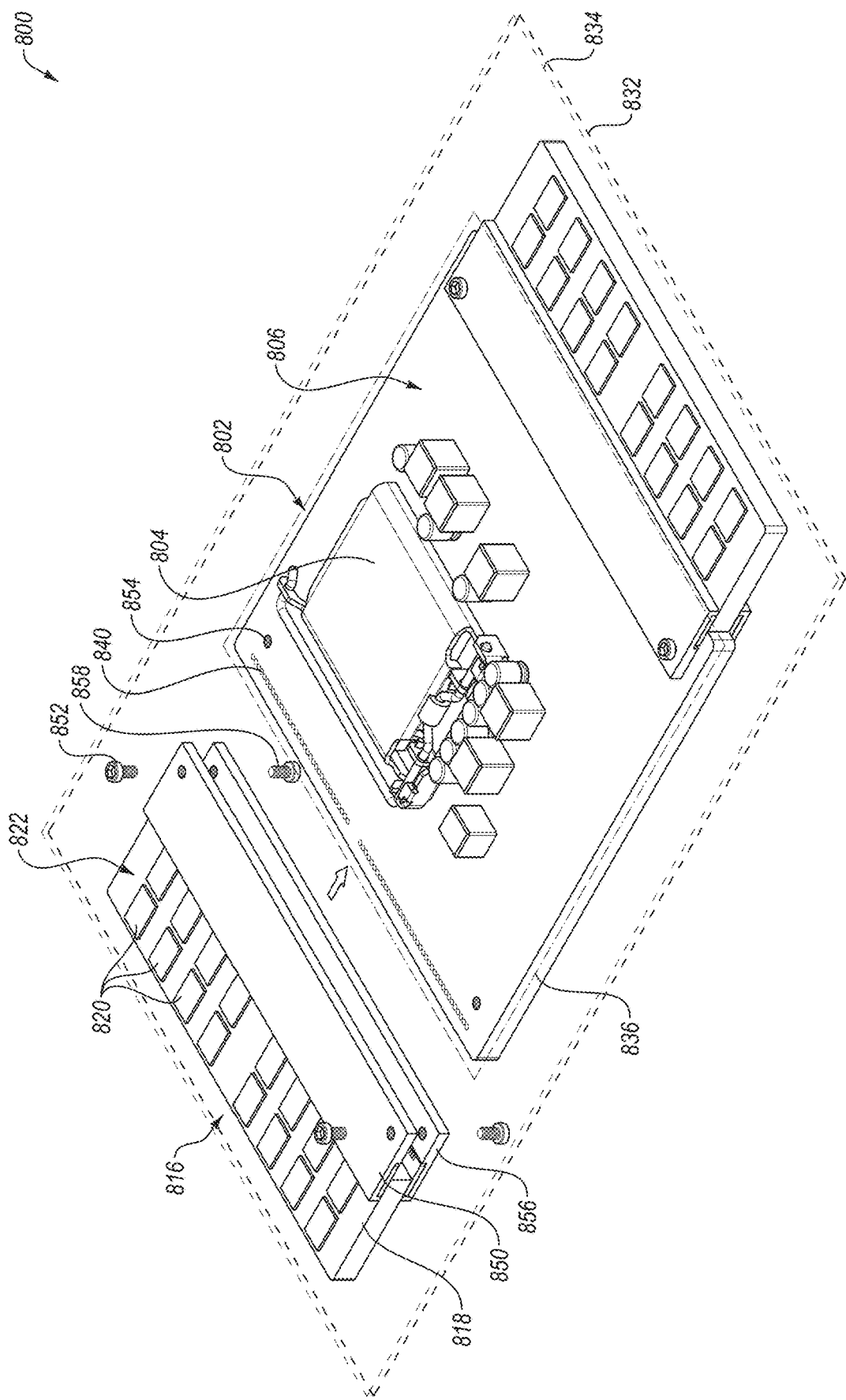
FIG. 8A is a perspective view of a functional block diagram illustrating another example device in accordance with at least one embodiment of the disclosure.
Figure 8B:
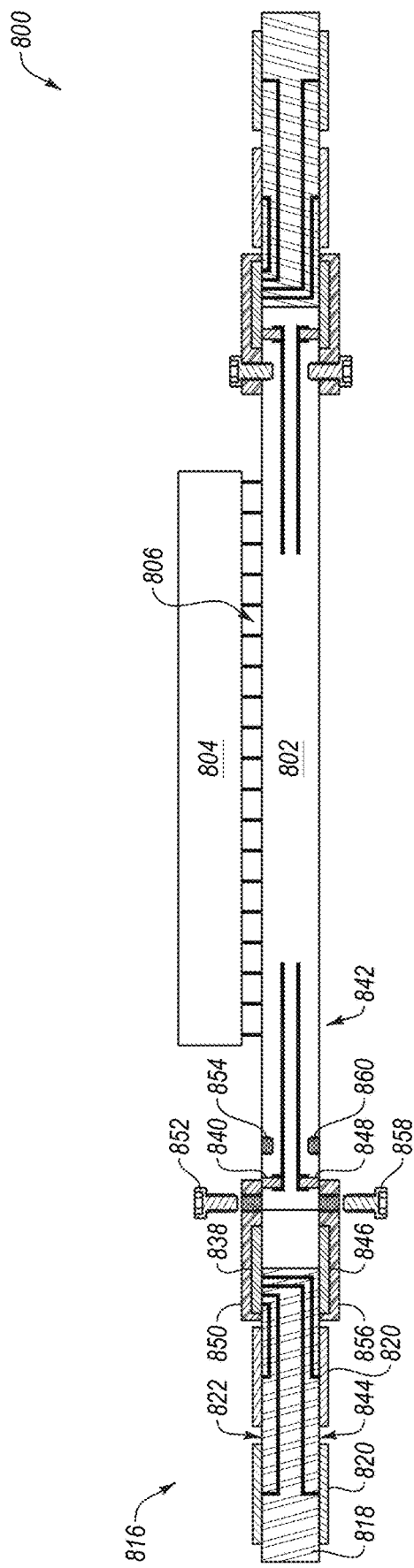
FIG. 8B is a side view of a functional block diagram illustrating the device of FIG. 8A in accordance with at least one embodiment of the disclosure.

FIG. 8A is a perspective view of a functional block diagram illustrating another example device 800 in accordance with at least one embodiment of the disclosure. FIG. 8B is a side view of a functional block diagram illustrating device 800 in accordance with at least one embodiment of the disclosure.

Device 800 may include a circuit board 802. A surface 806 (e.g., a major surface, e.g., a top surface) of circuit board 802 may be in a plane 832. Device 800 may include a memory module 816 to be electrically coupled to circuit board 802. A surface 822 (e.g., a major surface, e.g., a top surface) of memory module 816 may be in a plane 834. Plane 834 may be substantially parallel to plane 832. Memory module 816 may extend, in a direction substantially parallel to plane 832, from side 808 of circuit board 802. Side 808 of circuit board 802 may be substantially perpendicular to surface 806.

Device 800 may be the same as or substantially similar to device 600 of FIG. 6A and FIG. 6B, with the addition of support member 850 (which may be the same as or substantially similar to support member 750 of FIG. 7A and FIG. 7B) and support member 856 (which also may be the same as or substantially similar to support member 750 of FIG. 7A and FIG. 7B). More specifically, support member 856 may be the same as or substantially similar to support member 750, securing member 858 may be the same as or substantially similar to securing member 752 of FIG. 7A and FIG. 7B, and a hole 860 may be the same as or substantially similar to hole 754 of FIG. 7A and FIG. 7B.

In some embodiments, a hole 854 may be offset (in one or more directions) from hole 860. In other embodiments, hole 854 may substantially align with hole 860. In such embodiments, securing member 852 may extend through hole 854 and hole 860 such that securing member 852 includes securing member 858.

Some embodiments may include memory module 816 including an interface (e.g., electrically conductive lines 838, electrically conductive lines 846, support member 850 and/or support member 856) for electrically coupling memory module 816 to circuit board 802. As noted above, surface 806 of circuit board 802 may be in plane 832. Memory module 816 may include circuit board 818, which may include surface 822. Surface 822 may be in plane 834. Plane 834, when memory module 816 is electrically coupled to circuit board 802, may be substantially parallel to plane 832. In some embodiments, memory module 816 may include electrically conductive lines 838 extending from surface 822 of memory module 816 to surface 806 of circuit board 802 to provide for electrical coupling between circuit board 802 and memory module 816. In some embodiments, memory module 816 may include electrically conductive lines 846 extending from surface 844 (e.g., a major surface, e.g., a bottom surface) of memory module 816 to surface 842 (e.g., a major surface, e.g., a bottom surface) of circuit board 802. Surface 844 of memory module 816 may be opposite surface 822 of memory module 816. Surface 842 of circuit board 802 may be opposite surface 806 of circuit board 802.

Figure 9A:
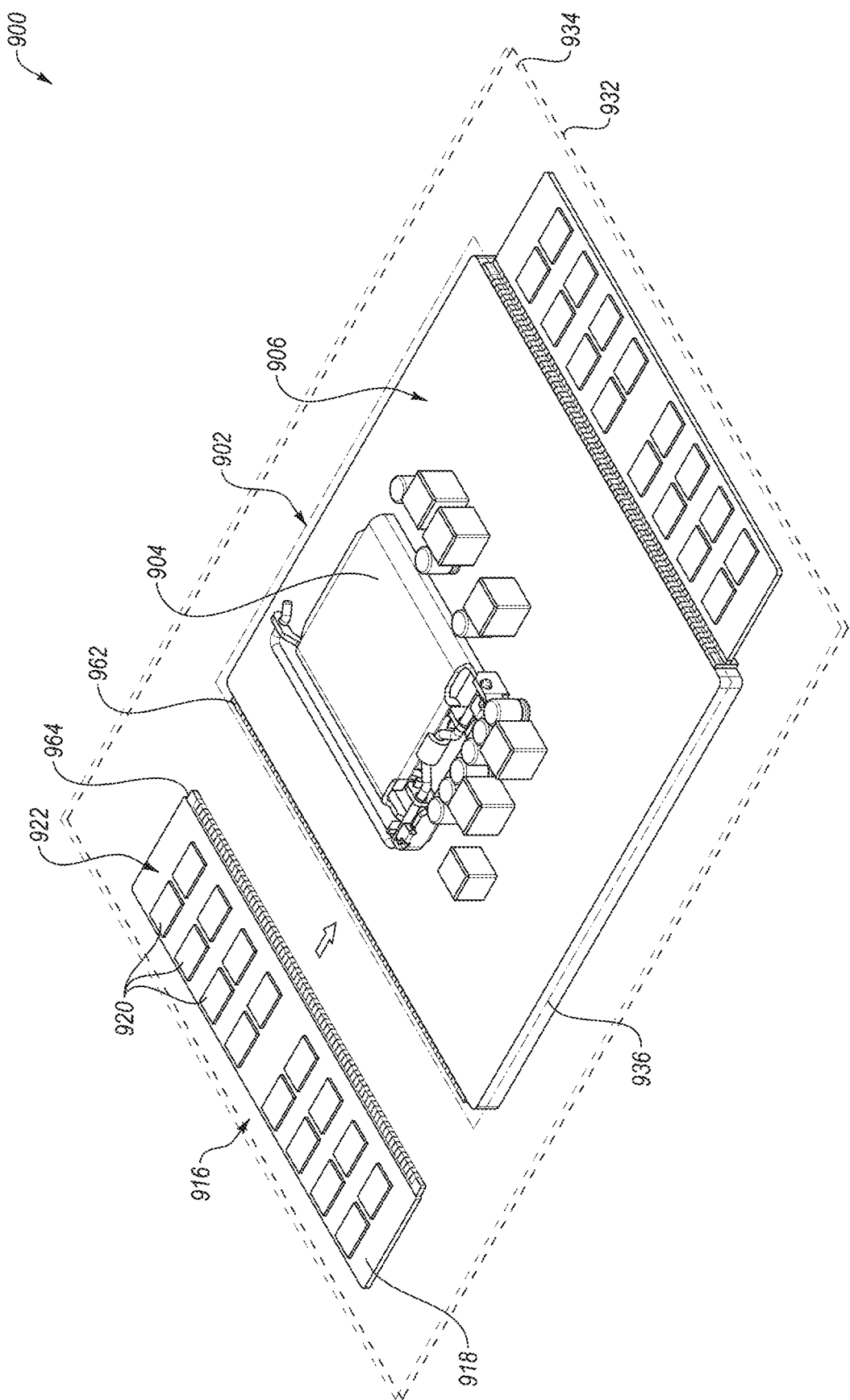
FIG. 9A is a perspective view of a functional block diagram illustrating another example device in accordance with at least one embodiment of the disclosure.
Figure 9B:
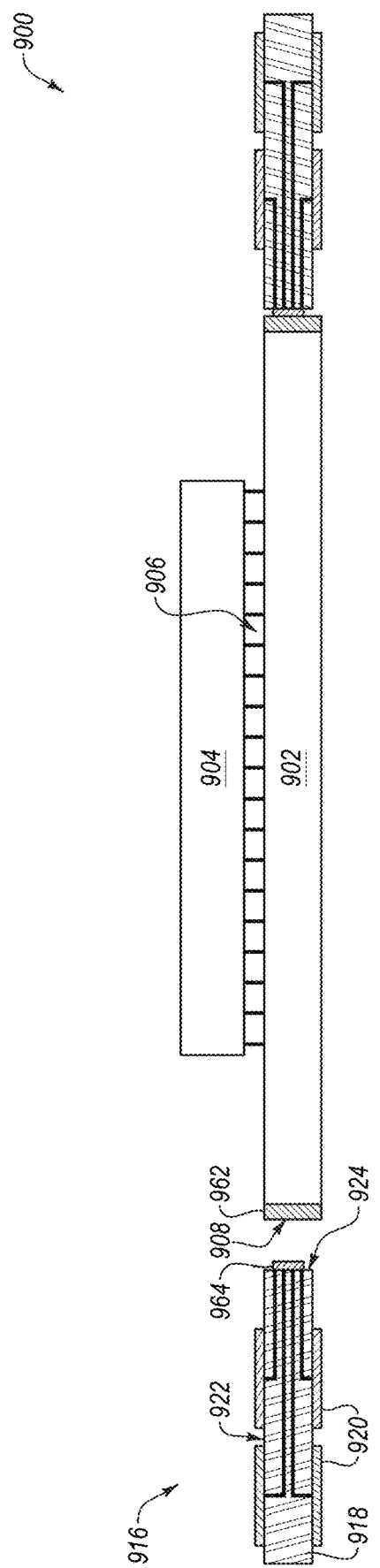
FIG. 9B is a side view of a functional block diagram illustrating the device of FIG. 9A in accordance with at least one embodiment of the disclosure.

FIG. 9A is a perspective view of a functional block diagram illustrating another example device 900 in accordance with at least one embodiment of the disclosure. FIG. 9B is a side view of a functional block diagram illustrating device 900 in accordance with at least one embodiment of the disclosure.

Device 900 may include a circuit board 902. A surface 906 (e.g., a major surface, e.g., a top surface) of circuit board 902 may be in a plane 932. Device 900 may include a memory module 916 to be electrically coupled to circuit board 902. A surface 922 (e.g., a major surface, e.g., a top surface) of memory module 916 may be in a plane 934. Plane 934 may be substantially parallel to plane 932. Memory module 916 may extend, in a direction substantially parallel to plane 932, from side 908 of circuit board 902. Side 908 of circuit board 902 may be substantially perpendicular to surface 906.

Device 900 may be the same as or substantially similar to device 500 of FIG. 5A and FIG. 5B, except that circuit board 902 may include pads 962 on side 908 and memory module 916 may include contacts 964 on side 924. Pads 962 may be functionally the same as or substantially similar to pads/vias 540 of FIG. 5A and FIG. 5B, except that pads 962 may be arranged on side 908 rather than on surface 906 of circuit board 902. Contacts 964 may be functionally the same as or substantially similar to electrically conductive lines 538 of FIG. 5A and FIG. 5B, except that contacts 964 may be arranged on side 924 of memory module 916. For example, pads 962 may be for electrically coupling to contacts 964. Such an electrical coupling may affect the electrical coupling of circuit board 902 with memory module 916.

Some embodiments may include memory module 916 including an interface (e.g., contacts 964) for electrically coupling memory module 916 to circuit board 902. As noted above, surface 906 of circuit board 902 may be in plane 932. Memory module 916 may include circuit board 918, which may include surface 922. Surface 922 may be in plane 934. Plane 934, when memory module 916 is electrically coupled to circuit board 902, may be substantially parallel to plane 932.

Figure 10A:
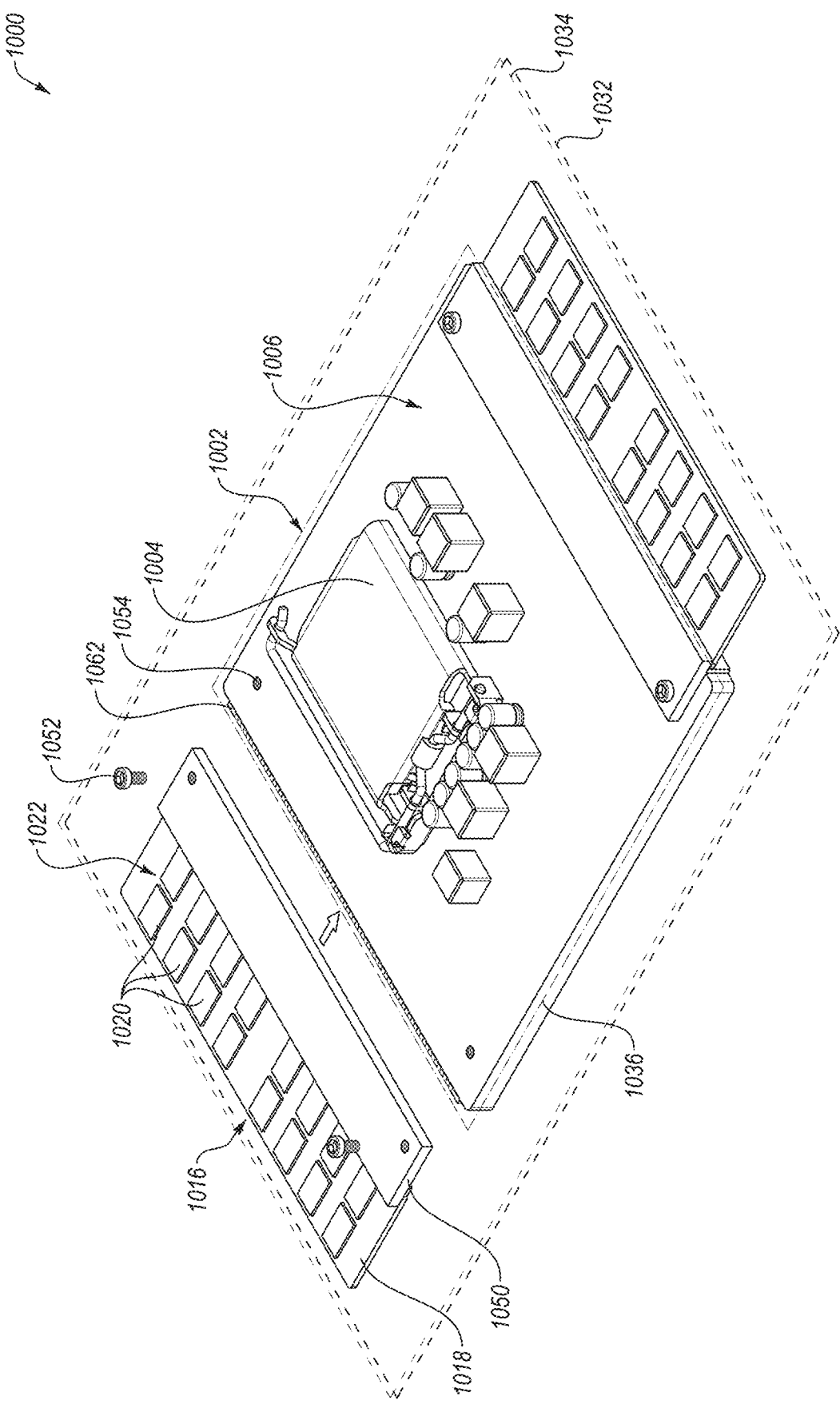
FIG. 10A is a perspective view of a functional block diagram illustrating another example device in accordance with at least one embodiment of the disclosure.
Figure 10B:
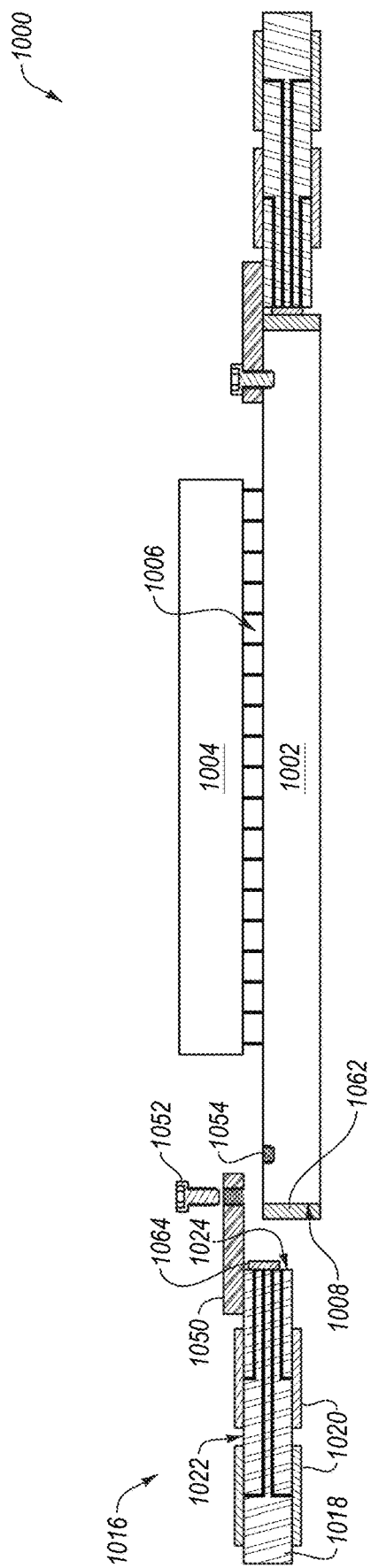
FIG. 10B is a side view of a functional block diagram illustrating the device of FIG. 10A in accordance with at least one embodiment of the disclosure.

FIG. 10A is a perspective view of a functional block diagram illustrating another example device 1000 in accordance with at least one embodiment of the disclosure. FIG. 10B is a side view of a functional block diagram illustrating device 1000 in accordance with at least one embodiment of the disclosure.

Device 1000 may include a circuit board 1002. A surface 1006 (e.g., a major surface, e.g., a top surface) of circuit board 1002 may be in a plane 1032. Device 1000 may include a memory module 1016 to be electrically coupled to circuit board 1002. A surface 1022 (e.g., a major surface, e.g., a top surface) of memory module 1016 may be in a plane 1034. Plane 1034 may be substantially parallel to plane 1032. Memory module 1016 may extend, in a direction substantially parallel to plane 1032, from side 1008 of circuit board 1002. Side 1008 of circuit board 1002 may be substantially perpendicular to surface 1006.

Device 1000 may be the same as or substantially similar to device 900 of FIG. 9A and FIG. 9B, with the addition of a support member 1050, a securing member 1052, and a hole 1054, which may be the same as or substantially similar to support member 750, securing member 752, and hole 754 (see FIG. 7A and FIG. 7B), respectively.

Some embodiments may include memory module 1016 including an interface (e.g., contacts 1064) for electrically coupling memory module 1016 to circuit board 1002. As noted above, surface 1006 of circuit board 1002 may be in plane 1032. Memory module 1016 may include a circuit board 1018, which may include surface 1022, which may be in plane 1034. Plane 1034, when memory module 1016 is electrically coupled to circuit board 1002, may be substantially parallel to plane 1032.

Some embodiments may include circuit board 1002 including pads 1062 on side 1008 of circuit board 1002. As noted above, side 1008 may be substantially perpendicular to surface 1006. Memory module 1016 may include contacts 1064 on side 1024 of memory module 1016. Side 1024 of memory module 1016 may be substantially perpendicular to surface 1022 of memory module 1016. Contacts 1064 on side 1024 of memory module 1016 may be for being electrically coupled to pads 1062 on side 1008 of circuit board 1002.

Figure 11A:
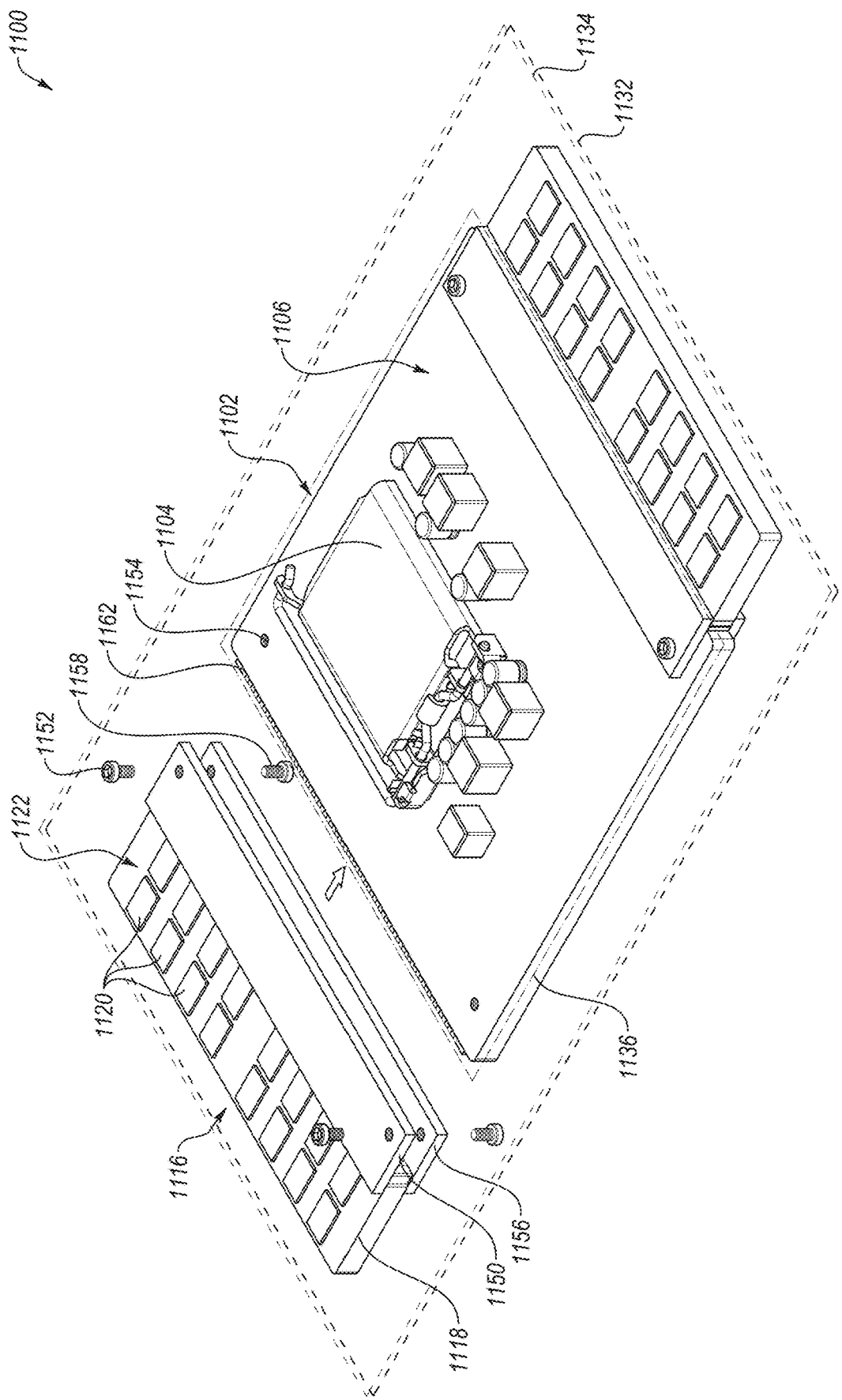
FIG. 11A is a perspective view of a functional block diagram illustrating another example device in accordance with at least one embodiment of the disclosure.
Figure 11B:
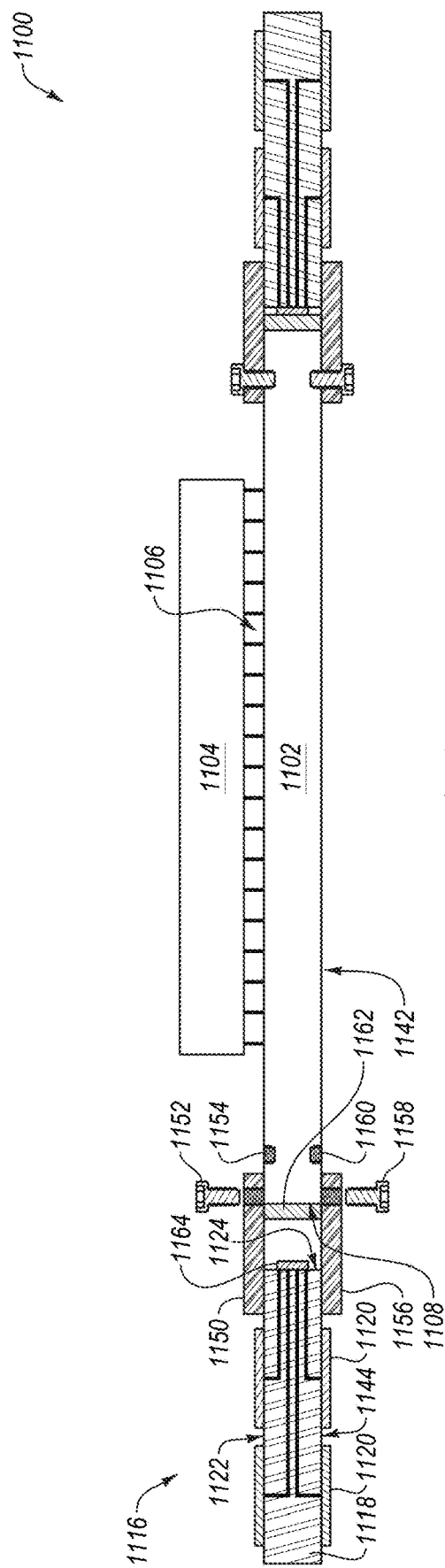
FIG. 11B is a side view of a functional block diagram illustrating the device of FIG. 11A in accordance with at least one embodiment of the disclosure.

FIG. 11A is a perspective view of a functional block diagram illustrating another example device 1100 in accordance with at least one embodiment of the disclosure. FIG. 11B is a side view of a functional block diagram illustrating device 1100 in accordance with at least one embodiment of the disclosure.

Device 1100 may include a circuit board 1102. A surface 1106 (e.g., a major surface, e.g., a top surface) of circuit board 1102 may be in a plane 1132. Device 1100 may include a memory module 1116 to be electrically coupled to circuit board 1102. A surface 1122 (e.g., a major surface, e.g., a top surface) of memory module 1116 may be in a plane 1134. Plane 1134 may be substantially parallel to plane 1132. Memory module 1116 may extend, in a direction substantially parallel to plane 1132, from side 1108 of circuit board 1102. Side 1108 of circuit board 1102 may be substantially perpendicular to surface 1106.

Device 1100 may be the same as or substantially similar to device 1000 of FIG. 10A and FIG. 10B, with the addition of a support member 1156, a securing member 1058, and a hole 1160, which may be the same as or substantially similar to support member 856, securing member 858, and hole 860 (see FIG. 8A and FIG. 8B), respectively.

Some embodiments may include memory module 1116 including an interface (e.g., contacts 1164) for electrically coupling memory module 1116 to circuit board 1102. As noted above, surface 1106 of circuit board 1102 may be in plane 1132. Memory module 1116 may include a circuit board 1118, which may include surface 1122. Surface 1122 may be in plane 1134. Plane 1134, when memory module 1116 is electrically coupled to circuit board 1102, may be substantially parallel to plane 1132.

Some embodiments may include a circuit board 1102 including pads 1162 on side 1108 of circuit board 1102. As noted above, side 1108 may be substantially perpendicular to surface 1106. Memory module 1116 may include contacts 1164 on side 1124 of memory module 1116. Side 1124 of memory module 1116 may be substantially perpendicular to surface 1122 of memory module 1116. Contacts 1164 on side 1124 of memory module 1116 may be for being electrically coupled to pads 1162 on side 1108 of circuit board 1102.

Some embodiments may include memory module 1116 including support member 1150 extending from surface 1122 of memory module 1116 to surface 1106 of circuit board 1102. As noted above, support member 1150 may be secured to surface 1106 of circuit board 1102 to physically attach the memory module 1116 to circuit board 1102. Support member 1150 may surround at least a portion of electrically conductive lines 1138. In some embodiments, memory module 1116 may include support member 1156 extending from surface 1144 (e.g., a major surface, e.g., a bottom surface) of memory module 1116 to surface 1142 (e.g., a major surface, e.g., a bottom surface) of circuit board 1102. Surface 1144 of memory module 1116 may be opposite surface 1122 of memory module 1116. Surface 1142 of circuit board 1102 may be opposite surface 1106 of circuit board 1102.

Figure 12:
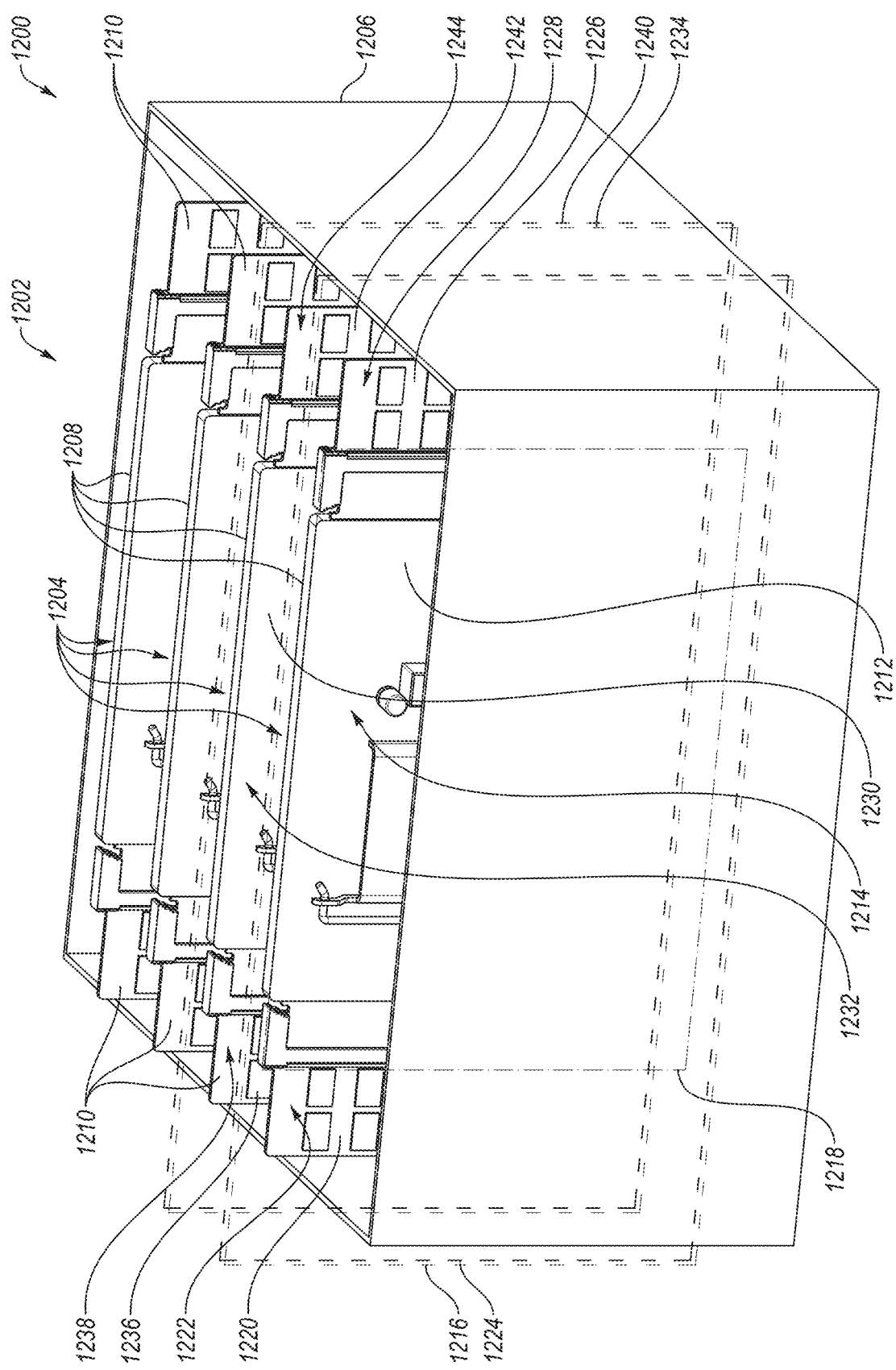
FIG. 12 is a perspective view of a functional block diagram illustrating another example device in accordance with at least one embodiment of the disclosure.

FIG. 12 is a perspective view of a functional block diagram illustrating a device 1200 in accordance with at least one embodiment of the disclosure. Device 1200 may include a server 1202. Server 1202 includes a number of cards 1204. Cards 1204 may be positioned within an immersion tank 1206. Immersion tank 1206 may be filled with coolant e.g., forming a coolant bath in which cards 1204 may be immersed.

Each of cards 1204 may include a respective one of circuit boards 1208. Each of cards 1204 may include a respective one of memory modules 1210. Each of memory modules 1210 may be electrically coupled to a respective one of circuit boards 1208. Any of device 100 of FIG. 1A and FIG. 1B, device 200 of FIG. 2A and FIG. 2B, device 300 of FIG. 3A and FIG. 3B, device 400 of FIG. 4A and FIG. 4B, device 500 of FIG. 5A and FIG. 5B, device 600 of FIG. 6A and FIG. 6B, device 700 of FIG. 7A and FIG. 7B, device 800 of FIG. 8A and FIG. 8B, device 900 of FIG. 9A and FIG. 9B, device 1000 of FIG. 10A and FIG. 10B, and device 1100 of FIG. 11A and FIG. 11B may be an example of one of cards 1204.

A surface 1214 (e.g., a major surface, e.g., a top surface) of a circuit board 1212, which may be one example of circuit boards 1208, may be substantially in a plane 1216. A surface 1222 (e.g., a major surface, e.g., a top surface) of a memory module 1220, which may be one example of memory modules 1210, may be in a plane 1224. Plane 1224 may be substantially parallel to plane 1216. Each of cards 1204 may be stacked in immersion tank 1206 in a direction that may be substantially perpendicular to plane 1216.

Memory module 1220, which may be one example of memory modules 1210, may extend, in a first direction substantially parallel to plane 1216, beyond footprint 1218 of circuit board 1212. Memory module 1226 may extend in a second direction (e.g., opposite the first direction) beyond footprint 1218 of circuit board 1212. The second direction, like the first direction, may be parallel to plane 1216. A surface 1228 (e.g., a major surface, e.g., a top surface) of memory module 1226, may be substantially in plane 1224 or in another plane (not illustrated in FIG. 12) that may be substantially parallel to plane 1216.

Device 1200 may also include a circuit board 1230, a memory module 1236 (electrically coupled to circuit board 1230), and a memory module 1242 (electrically coupled to circuit board 1230).

A surface 1232 (e.g., a major surface, e.g., a top surface) of circuit board 1230, which may be one example of circuit boards 1208, may be substantially in a plane 1234. A surface 1238 (e.g., a major surface, e.g., a top surface) of memory module 1236, which may be one example of memory modules 1210, may be in a plane 1240. Plane 1240 may be substantially parallel to plane 1234. Further, plane 1240 and plane 1234 may be substantially parallel to plane 1216.

Figure 13:
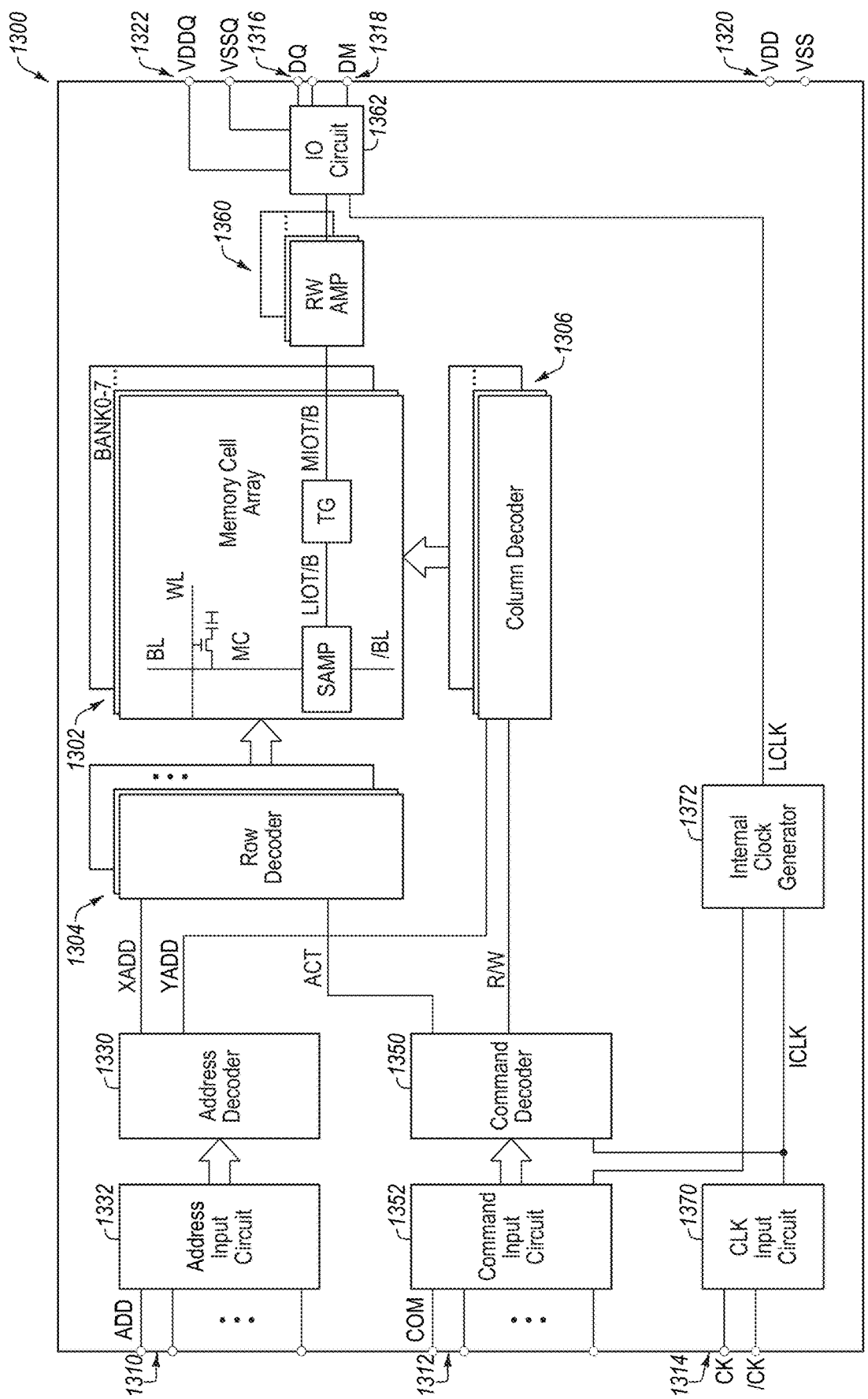
FIG. 13 is a block diagram illustrating an example memory device, in accordance with at least one embodiment of the disclosure.

FIG. 13 is a functional block diagram illustrating an example memory device 1300, in accordance with at least one embodiment of the disclosure. Memory device 1300 may include, for example, a DRAM (dynamic random-access memory), a SRAM (static random-access memory), a SDRAM (synchronous dynamic random-access memory), a DDR SDRAM (double-data-rate SDRAM, such as a DDR4 SDRAM and the like), a SGRAM (synchronous graphics random-access memory) or a three-dimensional (3D) DRAM. Memory device 1300, which may be integrated on a semiconductor chip, may include a memory array 1302.

In the embodiment of FIG. 13, memory array 1302 is shown as including eight memory banks BANK0-7. More or fewer banks may be included in memory array 1302 of other embodiments. Each memory bank includes a number of access lines (word lines WL), a number of data lines (bit lines BL and/BL), and a number of memory cells MC arranged at intersections of the number of word lines WL and the number of bit lines BL and/BL. The selection of a word line WL may be performed by a row decoder 1304 and the selection of the bit lines BL and /BL may be performed by a column decoder 1306. In the embodiment of FIG. 13, row decoder 1304 may include a respective row decoder for each memory bank BANK0-7, and column decoder 1306 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 1360 over complementary local data lines (LIOT/B), a transfer gate (TG), and complementary main data lines (MIOT/B). Conversely, write data output from read/write amplifiers 1360 may be transferred to sense amplifier SAMP over the complementary main data lines MIOT/B, transfer gate TG, and complementary local data lines LIOT/B, and written in the memory cell MC coupled to bit line BL or/BL.

Memory device 1300 may be generally configured to receive various inputs (e.g., from an external controller or host) via various terminals, such as address terminals 1310, command terminals 1312, clock terminals 1314, data terminals 1316, and data mask terminals 1318. Memory device 1300 may include additional terminals such as a power supply terminal 1320 and a power supply terminal 1322.

During a contemplated operation, one or more command signals COM, received via command terminals 1312, may be conveyed to a command decoder 1350 via a command input circuit 1352. Command decoder 1350 may include a circuit configured to generate various internal commands via decoding the one or more command signals COM. Examples of the internal commands include an active command ACT and a read/write signal R/W.

Further, one or more address signals ADD, received via address terminals 1310, may be conveyed to an address decoder 1330 via an address input circuit 1332. Address decoder 1330 may be configured to supply a row address XADD to row decoder 1304 and a column address YADD to column decoder 1306. Although command input circuit 1352 and address input circuit 1332 are illustrated as separate circuits, in some embodiments, address signals and command signals may be received via a common circuit.

An active command ACT may include a pulse signal that is activated in response to a command signal COM indicating row access (e.g., an active command). In response to active signal ACT, row decoder 1304 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 1306 may be activated, and bit line BL specified by the column address YADD may be selected.

In response to active command ACT, a read signal, a row address XADD, and a column address YADD, data may be read from the memory cell MC specified by row address XADD and column address YADD. The read data may be output via sense amplifier SAMP, transfer gate TG, read/write amplifiers 1360, an input/output circuit 1362, and data terminals 1316. Further, in response active command ACT, a write signal, a row address XADD, and a column address YADD, write data may be supplied to memory array 1302 via data terminals 1316, input/output circuit 1362, read/write amplifiers 1360, transfer gate TG, and sense amplifier SAMP. The write data may be written to the memory cell MC specified by row address XADD and column address YADD.

Clock signals CK and/CK may be received via clock terminals 1314. A CLK Input circuit 1370 may generate internal clock signals ICLK based on the clock signals CK and /CK. Internal clock signals ICLK may be conveyed to various components of memory device 1300, such as command decoder 1350 and an internal clock generator 1372. Internal clock generator 1372 may generate internal clock signals LCLK, which may be conveyed to input/output circuit 1362 (e.g., for controlling the operation timing of input/output circuit 1362). Further, data mask terminals 1318 may receive one or more data mask signals DM. When the data mask signal DM is activated, overwrite of corresponding data may be prohibited.

Memory device 1300 may be an example of any of memory devices 120 of FIG. 1A and FIG. 1B, memory devices 220 of FIG. 2A and FIG. 2B, memory devices 320 of FIG. 3A and FIG. 3B, memory devices 420 of FIG. 4A and FIG. 4B, memory devices 520 of FIG. 5A and FIG. 5B, memory devices 620 of FIG. 6A and FIG. 6B, memory devices 720 of FIG. 7A and FIG. 7B, memory devices 820 of FIG. 8A and FIG. 8B, memory devices 920 of FIG. 9A and FIG. 9B, memory devices 1020 of FIG. 10A and FIG. 10B, and memory devices 1120 of FIG. 11A and FIG. 11B. Further, any of memory modules 1210 of FIG. 12 may include one or more memory devices of which memory device 1300 may be an example.

Figure 14:
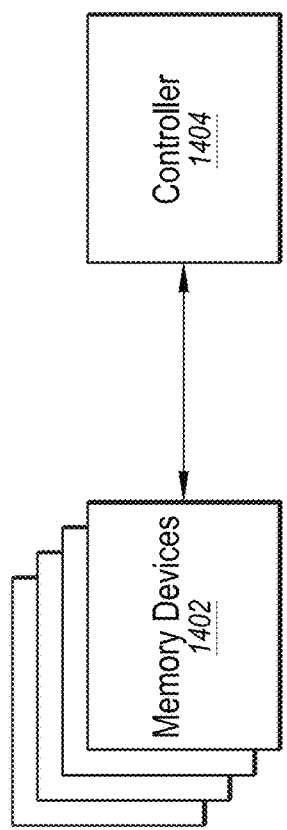
FIG. 14 is a simplified block diagram illustrating an example memory system, in accordance with at least one embodiment of the disclosure.

FIG. 14 is a simplified block diagram illustrating an example memory system 1400 implemented in accordance with at least one embodiment of the disclosure. Memory system 1400, which may include, for example, a semiconductor device, includes a number of memory devices 1402 and a controller 1404. Controller 1404 may be operatively coupled with memory devices 1402 so as to convey command/address signals (e.g., command/address signals received by command terminals 1312 and/or address terminals 1310 of FIG. 13) to memory devices 1402.

In some embodiments, a memory module, e.g., any of memory module 116 of FIG. 1A and FIG. 1B, memory module 216 of FIG. 2A and FIG. 2B, memory module 316 of FIG. 3A and FIG. 3B, memory module 416 of FIG. 4A and FIG. 4B, memory module 516 of FIG. 5A and FIG. 5B, memory module 616 of FIG. 6A and FIG. 6B, memory module 716 of FIG. 7A and FIG. 7B, memory module 816 of FIG. 8A and FIG. 8B, memory module 916 of FIG. 9A and FIG. 9B, memory module 1016 of FIG. 10A and FIG. 10B, and memory module 1116 of FIG. 11A and FIG. 11B may include one or more examples of memory system 1400 including one or more examples of controller 1404 and one or more examples of memory devices 1402.

In other embodiments, a circuit board, e.g., any of circuit board 102 of FIG. 1A and FIG. 1B, circuit board 202 of FIG. 2A and FIG. 2B, circuit board 302 of FIG. 3A and FIG. 3B, circuit board 402 of FIG. 4A and FIG. 4B, circuit board 502 of FIG. 5A and FIG. 5B, circuit board 602 of FIG. 6A and FIG. 6B, circuit board 702 of FIG. 7A and FIG. 7B, circuit board 802 of FIG. 8A and FIG. 8B, circuit board 902 of FIG. 9A and FIG. 9B, circuit board 1002 of FIG. 10A and FIG. 10B, and circuit board 1102 of FIG. 11A and FIG. 11B may include one or more examples of controller 1404. And, any of memory module 116 of FIG. 1A and FIG. 1B, memory module 216 of FIG. 2A and FIG. 2B, memory module 316 of FIG. 3A and FIG. 3B, memory module 416 of FIG. 4A and FIG. 4B, memory module 516 of FIG. 5A and FIG. 5B, memory module 616 of FIG. 6A and FIG. 6B, memory module 716 of FIG. 7A and FIG. 7B, memory module 816 of FIG. 8A and FIG. 8B, memory module 916 of FIG. 9A and FIG. 9B, memory module 1016 of FIG. 10A and FIG. 10B, and memory module 1116 of FIG. 11A and FIG. 11B may include one or more corresponding memory devices 1402.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 15:
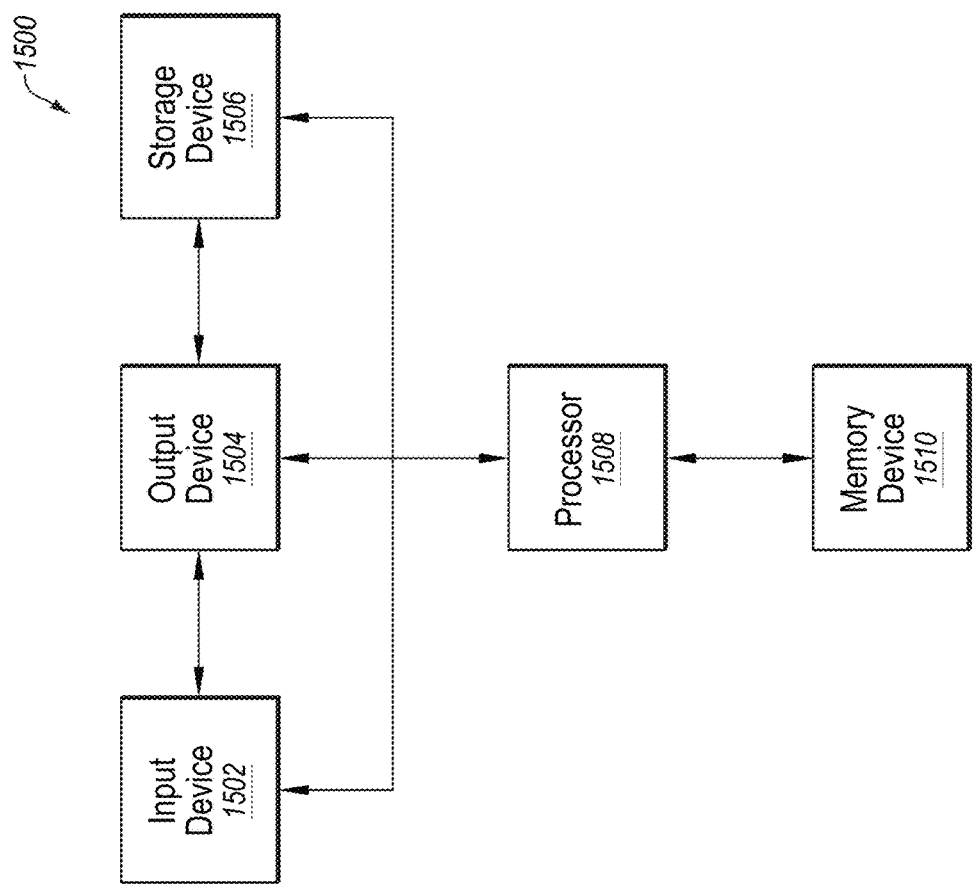
FIG. 15 is a simplified block diagram illustrating an example electronic system, in accordance with at least one embodiment of the disclosure.

FIG. 15 is a simplified block diagram illustrating an electronic system 1500 implemented in accordance with at least one embodiment of the disclosure. Electronic system 1500 includes at least one input device 1502, which may include, for example, a keyboard, a mouse, or a touch screen. Electronic system 1500 further includes at least one output device 1504, such as a monitor, a touch screen, or a speaker. Input device 1502 and output device 1504 are not necessarily separable from one another. Electronic system 1500 further includes a storage device 1506. Input device 1502, output device 1504, and storage device 1506 may be coupled to a processor 1508. Electronic system 1500 further includes a memory device 1510 coupled to processor 1508. Memory device 1510 may include at least a portion of memory system 1400 of FIG. 14. Electronic system 1500 may include, for example, a computing, processing, industrial, or consumer product. For example, without limitation, electronic system 1500 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Additional non-limiting examples of the disclosure include:

Example 1: A device comprising: a circuit board, a first major surface of the circuit board in a first plane, a processor on the first major surface of the circuit board; and a memory module electrically coupled to the circuit board, a second major surface of the memory module in a second plane, the second plane substantially parallel to the first plane, a portion of the memory module extending, in a direction substantially in the first plane, beyond a footprint of the circuit board.

Example 2: The device according to Example 1, wherein the memory module comprises a first memory module and wherein the device comprises a second memory module that extends, in a second direction substantially in the first plane, beyond the footprint of the circuit board.

Example 3: The device according to any of Examples 1 and 2, wherein the circuit board comprises a first circuit board, and wherein the memory module comprises: a second circuit board; and a number of memory devices electrically coupled to the second circuit board.

Example 4: The device according to any of Examples 1 through 3, wherein the device comprises a card for an immersion server.

Example 5: The device according to any of Examples 1 through 4, wherein the memory module extends from a side of the circuit board, the side of the circuit board substantially perpendicular to the first major surface.

Example 6: The device according to any of Examples 1 through 5, wherein the memory module is electrically coupled to the circuit board at a socket on the first major surface of the circuit board.

Example 7: The device according to any of Examples 1 through 6, wherein the socket comprises: a receiver portion for receiving a connector portion of the memory module; and a number of electrically conductive lines within the receiver portion, the number of electrically conductive lines for electrically coupling the memory module to the circuit board.

Example 8: The device according to any of Examples 1 through 7, wherein the memory module comprises a connector portion comprising: a structural-connection portion to be retained within a receiver portion of the socket; and a number of electrical contacts arranged on the structural-connection portion, each of the number of electrical contacts to electrically couple with a corresponding one of a number of electrically conductive lines of the socket.

Example 9: The device according to any of Examples 1 through 8, wherein the circuit board comprises a side substantially perpendicular to the first major surface and wherein the memory module is electrically coupled to the circuit board at a socket on the side of the circuit board.

Example 10: The device according to any of Examples 1 through 9, wherein the socket comprises: a receiver portion for receiving a connector portion of the memory module; and a number of electrically conductive lines within the receiver portion, the number of electrically conductive lines for electrically coupling the memory module to the circuit board.

Example 11: The device according to any of Examples 1 through 10, wherein the connector portion of the memory module comprises: a structural-connection portion to be retained within the receiver portion; and a number of electrical contacts arranged on the structural-connection portion, each of the number of electrical contacts to electrically couple with a corresponding one of the number of electrically conductive lines of the socket.

Example 12: The device according to any of Examples 1 through 11, wherein the memory module is electrically coupled to the circuit board at a socket on a second side of the memory module, the second side of the memory module substantially perpendicular to the second major surface of the memory module.

Example 13: The device according to any of Examples 1 through 12, wherein the socket comprises: a receiver portion for receiving a connector portion of the circuit board; and a number of electrically conductive lines within the receiver portion, the number of electrically conductive lines for electrically coupling the memory module to the circuit board.

Example 14: The device according to any of Examples 1 through 13, wherein the connection portion of the circuit board comprises: a structural-connection portion to be retained within the socket; and a number of electrical contacts arranged on the structural-connection portion, each of the number of electrical contacts to electrically couple with a corresponding one of the number of electrically conductive lines of the socket.

Example 15: The device according to any of Examples 1 through 14, wherein the memory module comprises electrically conductive lines extending from the second major surface of the memory module to the first major surface of the circuit board to provide for electrical coupling between the circuit board and the memory module.

Example 16: The device according to any of Examples 1 through 15, wherein the electrically conductive lines electrically couple to pads on the first major surface of the circuit board.

Example 17: The device according to any of Examples 1 through 16, wherein the electrically conductive lines electrically couple to vias in the first major surface of the circuit board.

Example 18: The device according to any of Examples 1 through 17, wherein the electrically conductive lines comprise first electrically conductive lines and wherein the memory module comprises second electrically conductive lines extending from a third major surface of the memory module to a fourth major surface of the circuit board, the third major surface of the memory module opposite the second major surface of the memory module, the fourth major surface of the circuit board opposite the first major surface of the circuit board.

Example 19: The device according to any of Examples 1 through 18, wherein the memory module further comprises a support member extending from the second major surface of the memory module to the first major surface of the circuit board.

Example 20: The device according to any of Examples 1 through 19, wherein the support member is secured to the first major surface of the circuit board to physically attach the memory module to the circuit board.

Example 21: The device according to any of Examples 1 through 20, wherein the support member surrounds at least a portion of the electrically conductive lines.

Example 22: The device according to any of Examples 1 through 21, wherein the memory module further comprises: a first support member extending from the second major surface of the memory module to the first major surface of the circuit board; and a second support member extending from a third major surface of the memory module to a fourth major surface of the circuit board, the third major surface of the memory module opposite the second major surface of the memory module, the fourth major surface of the circuit board opposite the first major surface of the circuit board.

Example 23: The device according to any of Examples 1 through 22, wherein the electrically conductive lines comprise first electrically conductive lines and wherein the memory module comprises second electrically conductive lines extending from the third major surface of the memory module to the fourth major surface of the circuit board.

Example 24: The device according to any of Examples 1 through 23, wherein the circuit board comprises a first side substantially perpendicular to the first major surface, wherein the circuit board comprises pads on the first side of the circuit board, wherein the memory module comprises contacts on a second side of the memory module, the second side of the memory module substantially perpendicular to the second major surface of the memory module, and wherein the contacts on the second side of the memory module are electrically coupled to the pads on the first side of the circuit board.

Example 25: The device according to any of Examples 1 through 24, wherein the memory module further comprises a support member extending from the second major surface of the memory module to the first major surface of the circuit board.

Example 26: A device comprising: a memory module comprising: an interface for electrically coupling the memory module to a first circuit board including a first major surface in a first plane; and a second circuit board comprising a second major surface, the second major surface in a second plane, the second plane to be substantially parallel to the first plane when the memory module is electrically coupled to the first circuit board.

Example 27: The device according to any of Examples 1 through 26, wherein the memory module further comprises a number of memory devices electrically coupled to the second circuit board.

Example 28: The device according to any of Examples 1 through 27, wherein the interface comprises a socket at a second side of the memory module, the second side of the memory module substantially perpendicular to the second major surface of the memory module.

Example 29: The device according to any of Examples 1 through 28, wherein the socket comprises: a receiver portion for receiving a connector portion of the first circuit board; and a number of electrically conductive lines within the receiver portion, the number of electrically conductive lines for electrically coupling the memory module to the first circuit board.

Example 30: The device according to any of Examples 1 through 29, wherein the memory module comprises electrically conductive lines extending from the second major surface of the memory module to the first major surface of the first circuit board to provide for electrical coupling between the first circuit board and the memory module.

Example 31: The device according to any of Examples 1 through 30, wherein the electrically conductive lines comprise first electrically conductive lines and wherein the memory module comprises second electrically conductive lines extending from a third major surface of the memory module to a fourth major surface of the first circuit board, the third major surface of the memory module opposite the second major surface of the memory module, the fourth major surface of the first circuit board opposite the first major surface of the first circuit board.

Example 32: The device according to any of Examples 1 through 31, wherein the memory module further comprises a support member extending from the second major surface of the memory module to the first major surface of the first circuit board.

Example 33: The device according to any of Examples 1 through 32, wherein the support member surrounds at least a portion of the electrically conductive lines.

Example 34: The device according to any of Examples 1 through 33, wherein the memory module further comprises: a first support member extending from the second major surface of the memory module to the first major surface of the first circuit board; and a second support member extending from a third major surface of the memory module to a fourth major surface of the first circuit board, the third major surface of the memory module opposite the second major surface of the memory module, the fourth major surface of the first circuit board opposite the first major surface of the first circuit board.

Example 35: The device according to any of Examples 1 through 34, wherein the electrically conductive lines comprise first electrically conductive lines and wherein the memory module comprises second electrically conductive lines extending from the third major surface of the memory module to the fourth major surface of the first circuit board.

Example 36: The device according to any of Examples 1 through 35, wherein the first circuit board comprises a first side substantially perpendicular to the first major surface, wherein the memory module comprises a second side substantially perpendicular to the second major surface of the memory module, wherein the memory module comprises electrical contacts on the second side of the memory module, and wherein the electrical contacts on the second side of the memory module are to be electrically coupled to electrical pads of the first side of the first circuit board.

Example 37: The device according to any of Examples 1 through 36, wherein the memory module further comprises a support member extending from the second major surface of the memory module to the first major surface of the first circuit board.

Example 38: A device comprising: a circuit board, a first major surface of the circuit board in a first plane; and an interface for electrically coupling the circuit board to a memory module, the interface configured such that a second major surface of the memory module is in a second plane substantially parallel to the first plane when the memory module is electrically coupled to the circuit board.

Example 39: The device according to Example 38, wherein the circuit board comprises a processor on the first major surface of the circuit board.

Example 40: The device according to any of Examples 38 and 39, wherein the interface comprises a socket on the first major surface of the circuit board.

Example 41: The device according to any of Examples 38 through 40, wherein the socket comprises: a receiver portion for receiving a connector portion of the memory module; and a number of electrically conductive lines within the receiver portion, the number of electrically conductive lines for electrically coupling the memory module to the circuit board.

Example 42: The device according to any of Examples 38 through 41, wherein the circuit board comprises a first side substantially perpendicular to the first major surface wherein the interface comprises a socket on the first side of the circuit board.

Example 43: The device according to any of Examples 38 through 42, wherein the socket comprises: a receiver portion for receiving a connector portion of the memory module; and a number of electrically conductive lines within the receiver portion, the number of electrically conductive lines for electrically coupling the memory module to the circuit board.

Example 44: The device according to any of Examples 38 through 43, wherein the circuit board comprises a first side substantially perpendicular to the first major surface, wherein the interface is at the first side of the circuit board, wherein the interface comprises: a structural-connection portion to be retained within a socket of the memory module; and a number of electrical contacts arranged on the structural-connection portion, each of the number of electrical contacts to electrically couple with a corresponding one of a number of electrically conductive lines of the socket.

Example 45: The device according to any of Examples 38 through 44, wherein the circuit board comprises a first side substantially perpendicular to the first major surface, wherein the circuit board comprises electrical pads on the first side of the circuit board.

Example 46: A device comprising: a socket for electrically coupling a memory module to a circuit board, a first major surface of the circuit board to be in a first plane, a second major surface of the memory module to be in a second plane substantially parallel to the first plane when the memory module is electrically coupled to the circuit board, the socket for receiving a connector portion, the connector portion at a first side of the circuit board, the first side of the memory module substantially perpendicular to the first major surface, the socket to be at a second side of the memory module, the second side substantially perpendicular to the second major surface.

Example 47: The device according to Example 46, wherein the socket comprises: a receiver portion for receiving the connector portion of the circuit board; and a number of electrically conductive lines within the receiver portion, the number of electrically conductive lines for electrically coupling the memory module to the circuit board.

Example 48: A device comprising: a socket for electrically coupling a memory module to a circuit board, the socket configured such that a first major surface of the circuit board is in a first plane and a second major surface of the memory module, while electrically coupled to the circuit board, is in a second plane substantially parallel to the first plane.

Example 49: The device according to Example 48, wherein the socket is to be on the first major surface of the circuit board.

Example 50: The device according to any of Examples 48 and 49, wherein the socket comprises: a receiver portion for receiving a connector portion of the memory module; and a number of electrically conductive lines within the receiver portion, the number of electrically conductive lines for electrically coupling the memory module to the circuit board.

Example 51: The device according to any of Examples 48 through 50, wherein the socket is to be at a side of the circuit board, the side of the circuit board substantially perpendicular to the first major surface of the circuit board.

Example 52: The device according to any of Examples 48 through 51, wherein the socket comprises: a receiver portion for receiving a connector portion of the memory module; and a number of electrically conductive lines within the receiver portion, the number of electrically conductive lines for electrically coupling the memory module to the circuit board.

Example 53: A device comprising: a server comprising: a card comprising: a circuit board, a first major surface of the circuit board substantially in a first plane; and a memory module electrically coupled to the circuit board, a second major surface of the memory module in a second plane, the second plane substantially parallel to the first plane.

Example 54: The device according to Example 53, wherein the memory module extends, in a direction substantially parallel to the first plane, beyond a footprint of the circuit board.

Example 55: The device according to any of Examples 53 and 54, wherein the memory module comprises a first memory module, wherein the first memory module extends, in a first direction substantially parallel to the first plane, beyond a footprint of the circuit board and wherein the device comprises a second memory module that extends, in a second direction substantially parallel to the first plane, beyond the footprint of the circuit board.

Example 56: The device according to any of Examples 53 through 55, wherein the circuit board comprises a first circuit board, and wherein the memory module comprises: a second circuit board; and a number of memory devices electrically coupled to the second circuit board.

Example 57: The device according to any of Examples 53 through 56, wherein the circuit board comprises a processor on the first major surface of the circuit board.

Example 58: The device according to any of Examples 53 through 57, wherein the card comprises a first card, wherein the circuit board comprises a first circuit board, wherein the memory module comprises a first memory module, and wherein the server further comprises: a second card comprising: a second circuit board, a third major surface of the second circuit board substantially in a third plane; and a second memory module electrically coupled to the second circuit board, a fourth major surface of the second memory module in a fourth plane, the fourth plane substantially parallel to the third plane.

Example 59: The device according to any of Examples 53 through 58, wherein the third plane is substantially parallel to the first plane.

Example 60: The device according to any of Examples 53 through 59, wherein the first card and the second card are stacked in a direction substantially perpendicular to the first plane.

Example 61: The device according to any of Examples 53 through 60, further comprising a coolant bath, wherein the card is immersed in the coolant bath.

Example 62: A device comprising: a circuit board, a first major surface of the circuit board in a first plane; and a memory module electrically coupled to the circuit board, a second major surface of the memory module in a second plane, the second plane substantially parallel to the first plane.

Example 63: The device according to Example 62, wherein the memory module extends, in a direction substantially in the first plane, beyond a footprint of the circuit board.

Example 64: The device according to any of Examples 62 and 63, wherein the circuit board comprises a processor on the first major surface of the circuit board.

In accordance with common practice, the various features illustrated in the drawings may not be drawn to scale. The illustrations presented in the disclosure are not meant to be actual views of any particular apparatus (e.g., device, system, etc.) or method but are merely idealized representations that are employed to describe various embodiments of the disclosure. Accordingly, the dimensions of the various features may be arbitrarily expanded or reduced for clarity. In addition, some of the drawings may be simplified for clarity.

Thus, the drawings may not depict all of the components of a given apparatus (e.g., device) or all operations of a particular method.

As used herein, the term "device" or "memory device" may include a device with memory but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device comprising:
    a server comprising:
        a card comprising:
            a circuit board, a first major surface of the circuit board substantially in a first plane and a first side surface of the circuit board at least substantially perpendicular to the first major surface of the circuit board; and
            a memory module electrically coupled to the circuit board, a second major surface of the memory module in a second plane, the second plane substantially parallel to the first plane and a second side surface of the memory module at least substantially perpendicular to the second major surface of the memory module and in contact with the first side surface of the circuit board.

2. The device of claim 1, wherein the memory module extends, in a direction substantially parallel to the first plane, beyond a footprint of the circuit board.

3. The device of claim 1, wherein the memory module comprises a first memory module, wherein the first memory module extends, in a first direction substantially parallel to the first plane, beyond a footprint of the circuit board and wherein the device comprises a second memory module that extends, in a second direction substantially parallel to the first plane, beyond the footprint of the circuit board.

4. The device of claim 1, wherein the card comprises a first card, wherein the circuit board comprises a first circuit board, wherein the memory module comprises a first memory module, and wherein the server further comprises:
    a second card comprising:
        a second circuit board, a third major surface of the second circuit board substantially in a third plane; and
        a second memory module electrically coupled to the second circuit board, a fourth major surface of the second memory module in a fourth plane, the fourth plane substantially parallel to the third plane.

5. The device of claim 1, further comprising a coolant bath, wherein the card is immersed in the coolant bath.

6. A device, comprising:
- a circuit board, a first major surface of the circuit board in a first plane, a processor on the first major surface of the circuit board and a first side surface of the circuit board at least substantially perpendicular to the first major surface of the circuit board; and
- a memory module electrically coupled to the circuit board via first electrically conductive lines, a second major surface of the memory module in a second plane parallel to the first plane, and a portion of the memory module extending in a direction at least substantially parallel to the first plane and a second side surface of the memory module at least substantially perpendicular to the second major surface of the memory module and in contact with the first side surface of the circuit board.

7. The device of claim 6, wherein the first electrically conductive lines extend from the second major surface of the memory module to the first major surface of the circuit board.

8. The device of claim 7, wherein the memory module comprises a number of second electrically conductive lines in electrical contact with the first electrically conductive lines at the second major surface of the memory module.

9. The device of claim 7, wherein the first electrically conductive lines are in electrical contact with a conductive structure formed within the circuit board, the conductive structure extending in a direction substantially perpendicular to the first plane.

10. The device of claim 9, wherein the conductive structure is in electrical contact with one or more third electrically conductive lines of the circuit board.

11. The device of claim 7, wherein the memory module comprises fourth electrically conductive lines extending from a third major surface of the memory module.

12. The device of claim 6, wherein the first electrically conductive lines at least partially secure the memory module to the circuit board.

13. The device of claim 6, wherein the first electrically conductive lines are at least partially sheathed in a non-conductive material.

\* \* \* \* \*